United States Patent [19]
Boyer et al.

[11] Patent Number: 5,410,546
[45] Date of Patent: Apr. 25, 1995

[54] APPARATUS AND METHOD FOR CRC COMPUTATION OVER FIXED LENGTH BLOCKS CONTAINING VARIABLE LENGTH PACKETS OF DATA RECEIVED OUT OF ORDER

[75] Inventors: Keith G. Boyer, Northglenn, Colo.; Kenneth R. Burns, Bloomington, Minn.; Thomas H. Gohl, Westminster, Colo.; Terry R. Gottehrer, Louisville, Colo.; Bernie R. Marasco, Lafayette, Colo.; Michael R. Stephens, Westminster, Colo.; Robert D. Thompson, Loveland, Colo.

[73] Assignee: Storage Technology Corporation, Louisville, Colo.

[21] Appl. No.: 146,531

[22] Filed: Nov. 1, 1993

[51] Int. Cl.⁶ .............................................. G06F 11/10
[52] U.S. Cl. .................................... 371/37.1; 371/40.1
[58] Field of Search ............................... 371/37.1, 40.1

[56] References Cited

U.S. PATENT DOCUMENTS 4,667,326  5/1987  Young et al. ................... 371/39.1
5,274,772  12/1993  Dunn et al. ..................... 395/275

Primary Examiner—Charles E. Atkinson
Attorney, Agent, or Firm—Duft, Graziano & Forest

[57] ABSTRACT

The present invention discloses a method and apparatus for computing CRC codes for fixed length page buffers of user data where the user data arrives from a transmission device in variable length packets with the packet contents being out of sequential order. The received data is written to a storage device after being restored to the correct sequential order. The data packets are comprised of a header portion and a data portion. The transmission and compression methods commonly employed by the transmission device dictates that the header portion of each packet follows the data portion. The present invention computes a complete CRC code for the data stored in a page buffer in real time as the packets are received by using several registers for saving intermediate CRC codes and circuitry to combine partial CRC codes for those packet portions received out of order. Additional circuitry is provided which reorders the data packet portions received out of order back into sequential order as the data is stored in a page buffer memory in real time. Computing the CRC codes in real time permits the saving of costs associated with other approaches that significantly buffer the incoming packets to permit subsequent reordering and CRC computation. The present invention assures data integrity of data from the time it is received from the compression unit until the time it is sent to the storage device. In addition, the present inventions ability to compute the CRC codes real time maintains optimal performance of data throughput of the storage subsystem. The present invention alleviates problems relating to delaying new data packet transmissions as deferred CRC computations are performed on previous packets reordered in temporary buffer memory.

11 Claims, 6 Drawing Sheets

APPARATUS AND METHOD FOR CRC COMPUTATION OVER FIXED LENGTH BLOCKS CONTAINING VARIABLE LENGTH PACKETS OF DATA RECEIVED OUT OF ORDER

FIELD OF THE INVENTION

The present invention relates to computation of a CRC code over a block of user data. More specifically, the present invention relates to computation of a CRC code over a fixed length block when the user data arrives out of order in variable length packets and the packets are stored in fixed length buffers restored to correct sequential order.

PROBLEM

It is common in data storage and transmission applications to use CRC (Cyclic Redundancy Check) codes for error checking of user data to assure integrity of the stored or transmitted data. The mathematical foundations for CRC and other error detection and correction codes are well chronicled in several publications including the textbook "Error-correcting Codes, Second Edition" by Peterson and Weldon (MIT Press, 1972). The CRC code for a block of data may be used to detect various types of errors in user supplied data.

It is also common in data storage and transmission applications to block user data into units larger than the smallest unit of transmission or storage. Such blocking helps to achieve optimal transmission speeds or storage densities. Optimal blocking size for a given application may vary depending on a number of factors such as transmission speeds, physical characteristics of the storage device, access speed of the storage device, or reliability of the transmission or storage mediums. In practice several differing blocking factors may be employed for different purposes within a single subsystem.

A problem arises when using CRC codes on blocks of user supplied data if the data is not received in sequential order. CRC code computations are dependent on the order of the data supplied to the CRC computation apparatus. In the context of the present invention, a data compression unit supplies variable sized packets of data to be written to a computer tape storage unit in fixed size blocks. Buffering hardware assembles one or more of the variable length packets of compressed data into fixed size blocks of memory referred to as page buffers. The page buffers are appropriately sized for optimal transmission of data to a tape storage device. The IBM IDRC is an example of such a data compression unit which is designed in compliance with the European Computer Manufacturers Association (ECMA) standard number 152 entitled "Data interchange on 12.5 mm 18-track magnetic tape cartridges—extended format".

In this context it is desirable to compute a CRC on the data stored in each page buffer as it awaits transmission to the tape storage device. The data from the compression unit is supplied in packetized portions comprising a header portion and a data portion. Though the header portion logically precedes the data portion, the methods employed for the data compression require that the header portion be sent from the compression unit after the data portion is sent. This order of the packets presents a problem in CRC computation because the data is received out of order.

One may attempt to avoid this problem by computing the CRC for a page buffer only after all portions of the data packet have been received and reassembled in proper order. However, such solutions may impose performance limitations on the storage subsystems by delaying the CRC computations. Delaying the CRC computation may require that reception of further data from the compression unit be delayed until the CRC generation of the previous page buffers have been completed. This approach may result in decreased subsystem performance because of the delays in computing a CRC code for a page buffer. The potential loss of subsystem performance might be overcome by the addition of buffers to hold incoming data from the compression unit as prior packets are processed and CRC codes are computed. Such a technique is often referred to as double buffering. However the costs of adding such buffering and associated complexities could add significant costs to the subsystem. Another problem with such buffering solutions is that they do not assure data integrity of the data from the receipt from the compression unit till transmission to the storage device. Instead the data resides temporarily in a new buffer without data integrity assurance as the data is written to that temporary buffer.

SOLUTION

The present invention discloses a method and apparatus for computing a CRC code over the bytes stored in fixed size memory buffers. Data bytes stored in these buffers are packetized user data received from a data compression unit with the contents of each packet out of order. Partial CRC computations from the data portions of data packets are saved and then combined with the CRC code computed as the header portion is later received. This combined CRC code is equivalent to a CRC computed after all data received out of order is restored to correct sequential order. The present invention also permits reassembly of the data packets into proper order in fixed size memory buffers in preparation for transmission to the tape storage device.

In the context of the present invention, data is received from a blocking/compression unit in variable length packets. The data packets are intended for storage on a block oriented storage device such as a helical scan tape storage device. The received data packets are sent to page buffer memory circuitry adapted to assemble and store the variable length packets into fixed length memory buffers, (hereafter referred to as page buffers), in preparation for transmission to the block storage device. The variable length packets may be short enough to span only a fraction of the space in a single page buffer or may be long enough to span multiple page buffers.

A finite state machine controls the operation of the page buffer memory to store the bytes of the data packets in proper sequential order with the header first rather than the order in which they are received from the blocking/compression unit with the header last. The finite state machine logic reserves an area in the page buffer being written when it senses the start of a data portion of a packet. This reserved area is used later to write the header portion of a data packet into the page buffer memory after the data portion is received and written to page buffer memory. The data portion of a packet is stored in page buffer memory as the bytes are received while leaving the reserved area available for the header portion to be received later. The finite state machine logic resets address generation logic within the page buffer memory to the address of the reserved area when the packet header portion is received from the blocking/compression unit. This circuitry of the present invention permits the data packets to be stored and properly located in page buffer memory in real time as data packets are received out of order with the header portion following the data portion. This alleviates the need for extra memory to double buffer a packet of data for reassembly of the packet to the proper sequential order before it is stored in page buffer memory.

Simultaneous with the reception and writing of data packets to a page buffer, the data packets are received by page CRC generation circuitry which computes a CRC code over the data bytes of a packet in real time as they are received and stored in a page buffer. The page CRC generation circuitry computes a CRC code for the data portion of a packet as it is stored in a page buffer following the locations reserved for the header portion of the packet. A separate CRC code is computed for the header portion of a packet as it is received and stored in reserved locations of the page buffer. These two CRC codes are partial CRC codes. Neither partial CRC code represents the CRC code for the entire packet nor for the entire page buffer. Additional logic within the page CRC generation combines partial CRC codes to produce a resultant CRC code equal to a CRC code computed for the same bytes had those bytes been received in normal sequential order. Depending on where the beginning of a data packet is stored in a page buffer as well as its length, page CRC generation logic may save several partial CRC codes computed for sections of data stored in page buffers.

If the start of a packet is stored at the beginning of a page buffer, then it represents the first bytes in the page buffer so that there is no partial CRC code for data in the page buffer prior to the packet. If the start of a packet is stored other than at the start of the page buffer, there is a partial CRC code saved in the page CRC generation logic for the data packets received and stored in the page buffer prior to this packet. Partial CRC codes for the current packet's data and header portions as well as any partial CRC code for data stored in a page buffer before the current packet are combined to compute a resultant CRC code for the page buffer. The resultant CRC code is equivalent to a CRC code computed for all the data stored in the page buffer had the data been received in correct sequential order.

If the last byte of a packet is stored in the last byte of a page buffer, then there is no partial CRC code to be saved for that page buffer since no further data is written to the page buffer. If the last byte of a packet ends other than at the last byte of a page buffer, then a partial CRC for all data written to the page buffer including this packet is saved for combination with partial CRC codes computed for subsequent packets yet to be received.

A finite state machine controls the operation of the page CRC generation circuitry to adjust and combine partial CRC codes computed over portions of bytes stored in a page buffer received out of sequential order from the blocking/compression unit. Partial CRC codes are saved and later combined with other partial CRC codes. This permits the present invention to create a complete CRC code for the bytes of an entire page buffer as though the bytes for the page buffer had been received in sequential order. This circuitry of the present invention permits the CRC computation over the bytes in a page buffer to occur in real time as the bytes in data packet portions are received out of order.

The finite state machine transmits completed CRC codes for page buffers to a control processor for subsequent processing. The completed CRC code for each filled page buffer is saved within the control processor for later processing when the page buffer is written to a storage device.

The control processor transmits the filled page buffers for which the page CRC generation has completed a CRC code to a storage device when appropriate to write the page buffer to the storage medium. In doing so the control processor computes a check CRC code over the bytes of the page buffer as each byte is read from the page buffer and sent to the storage device. If the check CRC code matches the saved CRC code computed by the page CRC generation circuitry then the page buffer data is known to have been correctly stored in the page buffer until it was transmitted to the storage device. If the two CRC codes do not compare, appropriate error recovery procedures, beyond the scope of the present invention, may be invoked by the control processor.

As described above, the present invention comprises circuitry to combine two partial CRC codes computed over sections of data received out of sequential order. The present invention compensates for this order dependency when combining partial CRC codes by mathematically adjusting the partial CRC codes to combine them for a final CRC code.

The mathematical operations performed are with respect to any finite field $GF(2^n)$. The root basis of this field is binary. The extension of the binary field is defined by the polynomial $G(x)$. $G(x)$ defines the Galois field $GF(2^n)$. This field is of finite length. The elements of this field are n_tuples. Addition in this field is accomplished by summing two or more n_tuples bit-wise and modulo two. GF multiplication of two n_tuples is done modulo $G(x)$. This means that the two numbers are multiplied as two polynomials with binary coefficients. The result is then reduced by the polynomial $G(x)$ until it has order less than $G(x)$. In other words, the result is the remainder modulo $G(x)$.

The page CRC generation logic of the present invention expands on concepts presented by Peterson and Weldon in Chapter 7 of "Error-correcting Codes, Second Edition". The present invention utilizes a Galois Field multiplier circuit for combining two partial CRC codes computed over two portions of contiguous data received out of the sequential order required for normal CRC code computations. This technique applies the mathematical observation that the CRC code of an entire block of bytes numbered 0 through n may be expressed as the combination of two partial CRC codes; a first partial CRC code computed for bytes 0 through x-1 and a second CRC code computed for bytes x through n. Bytes x through n represent the data portion of the packets and precedes bytes 0 through x-1 representing the header portion as sent from the data compression unit. The first CRC code must be adjusted by multiplication with a CRC adjustment code to account for the data portion which logically would have followed the header had the data been in sequential order. The adjustment code permits the first CRC code (as adjusted) to be added to the second CRC code. The second CRC code and the adjusted first CRC code may then be added modulo 2 to produce the resultant CRC code which is equivalent to the CRC code for the full block computed as though the bytes been received in sequential order. The adjustment code is computed using another CRC generator circuit operating in parallel with the computation of the second partial CRC code but receiving zeroes as input for its CRC computation rather than the input data stream.

The present invention further comprises circuitry which stores the bytes of data packet header portions into appropriate reserved areas of the page buffers as the header portions are received out of order. Space is reserved in the memory of a page buffer for the header portion which follows the reception and storing of the data portion. When the header portion is later received from the compression unit it is written in the area earlier reserved for it in the page buffer. This reserved area precedes the area in which the data portion was written so that the header portion will be restored to correct order before the data portion in page buffer memory.

Finite state machines are utilized which control the logic and sequencing of the CRC computations and the writing of variable sized data packets received out of order into the page buffers.

The present invention permits the CRC computation over large blocks of data containing variable length packets of data wherein portions of each packet are received out of natural sequential order. The apparatus and method disclosed herein enables a cost effective solution to the problem in simple circuitry as compared to other solutions. The present invention assures the integrity of the data at all times between receipt from the compression unit and transmission to the storage device. In addition, the present invention permits these CRC computations and combinations to proceed as the data is received without loss of performance at the high data rates common in current high density tape storage subsystems.

DETAILED DESCRIPTION

Overview

Figure 1:
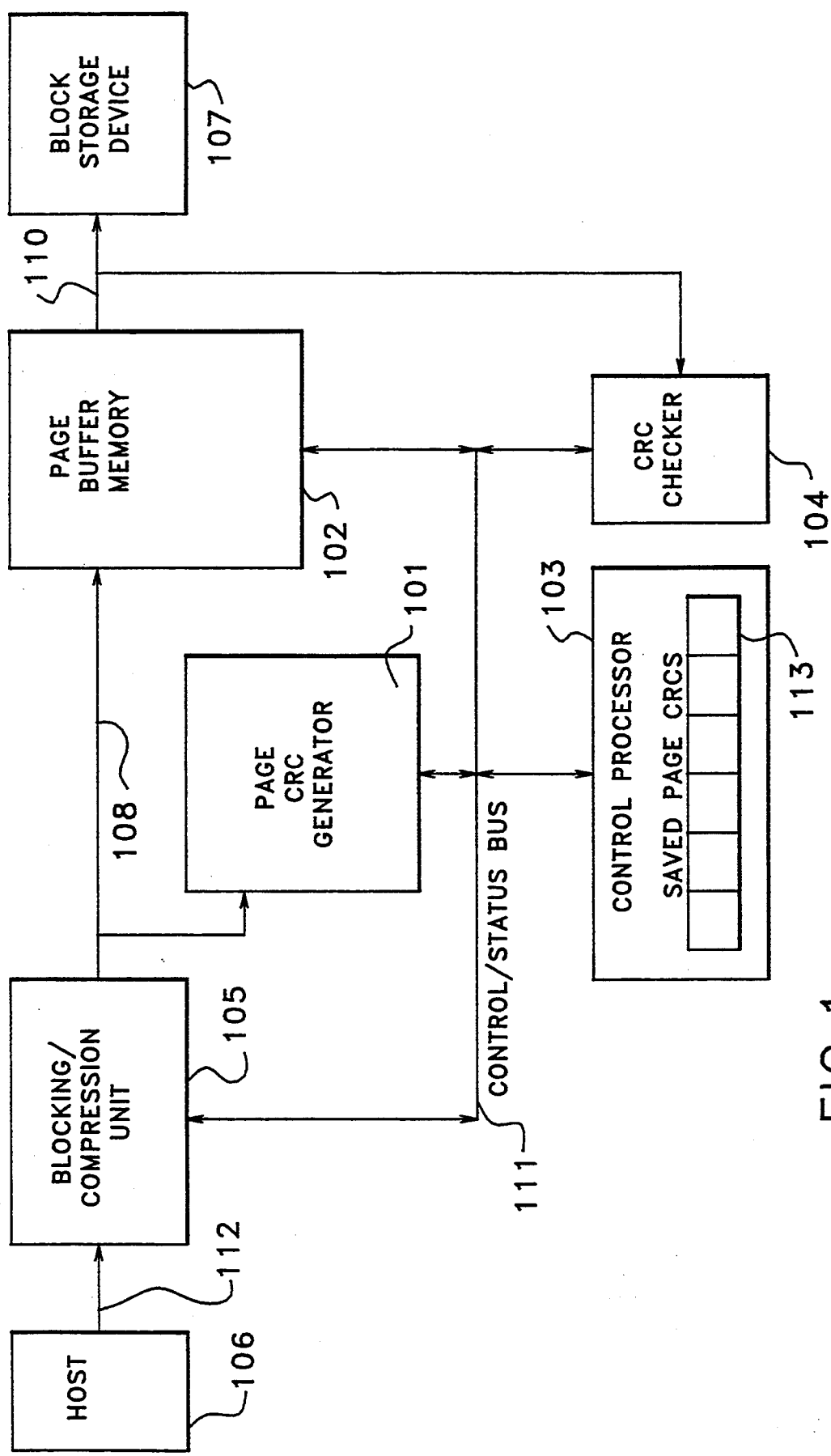
FIG. 1 is a block diagram of the present invention as applied in the context of tape storage subsystem receiving, blocking and storing variable length data packets.

FIG. 1 depicts a Page CRC Generator 101 and a Page Buffer Memory 102 of the present invention in the context of a tape storage subsystem application. Host 106 transmits user supplied data over link 112 to Blocking/Compression Unit 105. Blocking/Compression Unit 105 compresses the data and transmits the data over bus 108 in packets to both Page CRC Generator 101 for CRC generation and to Page Buffer Memory 102 for temporary storage. The compression techniques employed by Blocking/Compression Unit 105 require that a header portion of the data packet, which logically is to precede the data portion in Page Buffer Memory 102, is physically transmitted after the end of the data portion of the packet. Status information regarding the sequencing of the packet header portion and data portion is sent from Blocking/Compression Unit 105 to both Page CRC Generator 101 and Page Buffer Memory 102 over Control/Status Bus 111.

The variable length packets transmitted over bus 108 are received and stored in Page Buffer Memory 102 in fixed length blocks of memory referred to as page buffers. Page Buffer Memory 102 contains an appropriate number of page buffers for the performance goals of the tape storage subsystem and the physical characteristics of the Block Storage Device 107. The data packets generated by Blocking/Compression Unit 105 are variable in length. Logic within Page Buffer Memory 102 writes the variable length data packets into page buffers and simultaneously reorders the data so that the header portion of a packet, received after the data portion of a packet, is physically positioned before the data portion in page buffer memory. Variable length data packets generated by Blocking/Compression Unit 105 may be as short as a fraction of the size of a page buffer or may span multiple page buffers.

Figure 4:
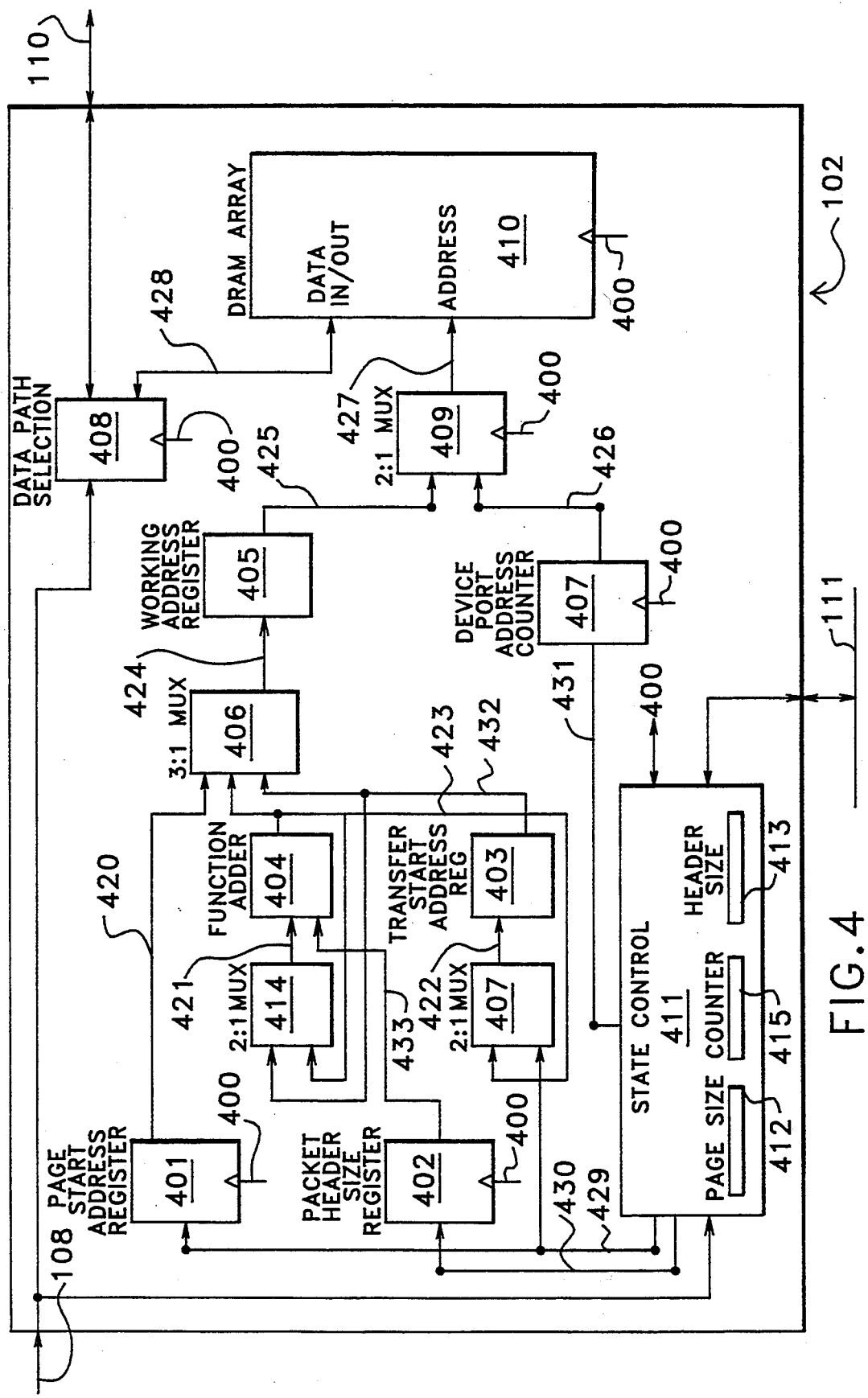
FIG. 4 shows further details of the Page Buffer Memory block of FIG. 1.

To accomplish the reordering of the data so that the packet header portion is stored in Page Buffer Memory 102 before the data portion of a packet, State Control Logic 411 of FIG. 4 controls the address generation to DRAM ARRAY 410. The address generation to DRAM ARRAY 410 is adjusted to skip over locations in Page Buffer Memory 102 when the first byte of a data portion of a packet is received. Skipping over locations in DRAM ARRAY 410 reserves locations in Page Buffer Memory 102 for the header portion of a packet yet to be received. The later reception of the packet header portion causes State Control Logic 411 to reset the address generation to DRAM ARRAY 410 back to the location earlier reserved for the header portion. The details of the operation of Page Buffer Memory 102 are discussed later and are best understood in the context of examples to be discussed later.

Page CRC Generator 101 computes a CRC code on the data received over bus 108 simultaneously with the Page Buffer Memory 102 storing the data in page buffers. The CRC codes computed by Page CRC Generator 101 are partial in the sense that separate CRC codes are computed for the header and data portions of a packet as each is received out of order. CRC computations are dependent on the order of the data applied to the computation. Logic within Page CRC Generator 101 combines these partial CRC codes to produce a resultant CRC code equivalent to the CRC code for the combined data as if the data had been received in normal sequential order. Partial CRC codes are computed and temporarily saved within Page CRC Generator 101 to compute complete CRC codes for a page buffer as it is filled by packets.

A complete CRC code for a filled page buffer is sent over Control/Status Bus 111 from Page CRC Generator 101 to Control Processor 103 for later processing. The details of the operation of Page CRC Generator 101 are discussed later and are best understood in the context of examples to be discussed later.

Control Processor 103 records a filled page buffer's completed CRC code in Saved Page CRCs 113 when it receives the completed CRC code for the filled page buffer from Page CRC Generator 101 over Control/Status Bus 111. The CRC codes saved in Saved Page CRCs 113 are used in subsequent processing by Control Processor 103 when it writes data from Page Buffer Memory 102 to Block Storage Device 107 of FIG. 1. Control Processor 103 controls Page Buffer Memory 102 to write page buffers onto Block Storage Device 107 for permanent storage. Control Processor 103 controls Page Buffer Memory 102 over Control/Status Bus 111 to read data from a particular completed page buffer and transmit the data over bus 110 to both Block Storage Device 107 and CRC Checker 104. CRC Checker 104 computes a CRC code for the entire page buffer as each byte is transmitted over bus 110 to Block Storage Device 107. Control Processor 103 inquires over Control/Status Bus 111 of CRC Checker 104 if the computed CRC matches the recorded CRC for the page buffer as stored in Saved Page CRCs 113. Control Processor 103 may invoke appropriate error recovery procedures when it detects a compare error from CRC Checker 104. Control Processor 103 may be implemented as a general purpose computer or other form of control logic.

Page CRC Generator

Figure 2:
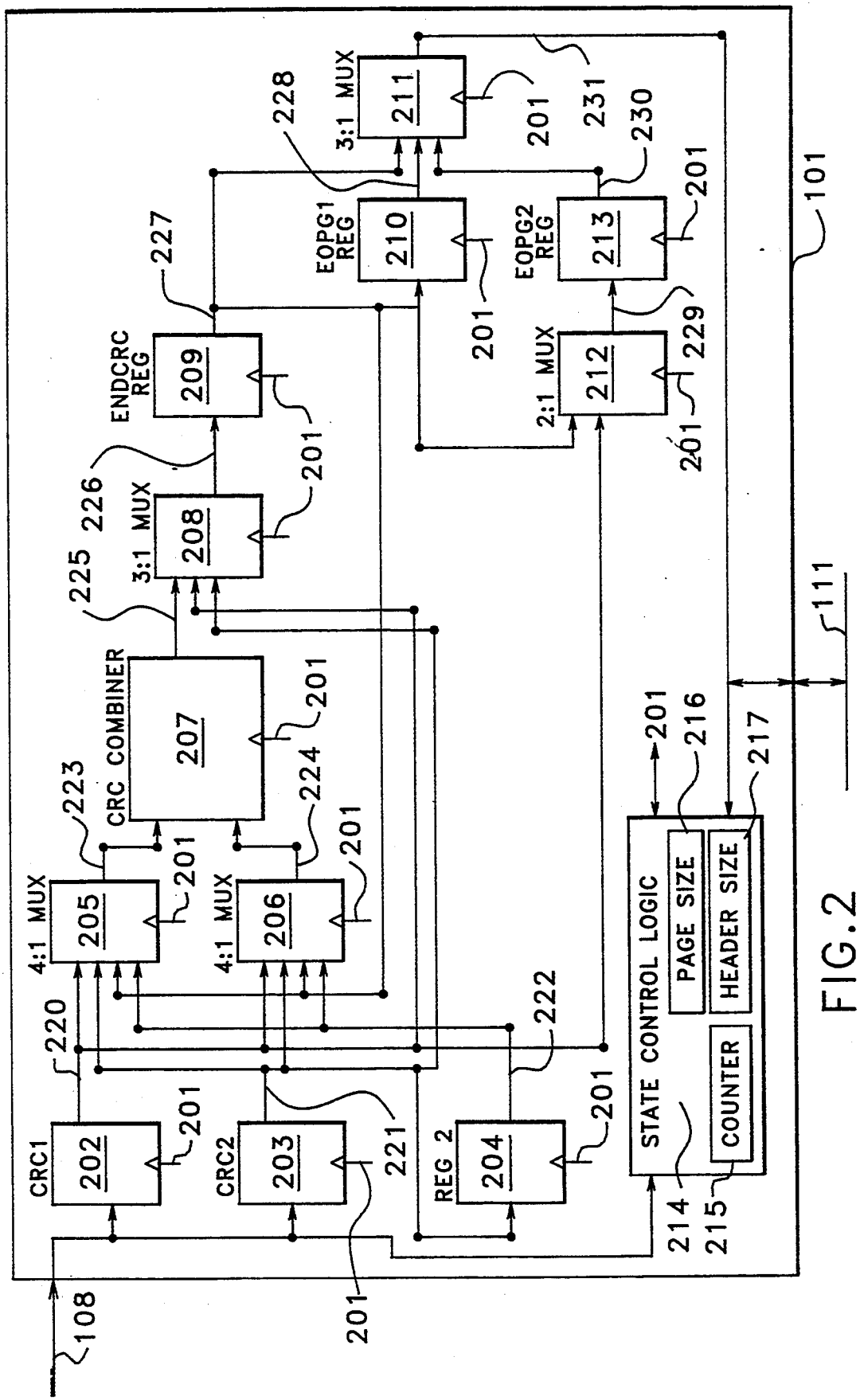
FIG. 2 shows further details of the Page CRC Generator block of FIG. 1.

FIG. 2 provides further detail of Page CRC Generator 101. State Control Logic 214 sends and receives status and information to or from other components depicted in FIG. 1 over Control/Status Bus 111. State Control Logic 214 is a finite state machine which sends signals over Control Signal Bus 201 to other components of FIGS. 2 and 3 to cause each component to perform its function. Operation of the Page CRC Generator 101 is more readily understood by following examples of the state machine operation of State Control Logic 214. Such examples are discussed later. First, a description of the function of each component provides an appropriate basis for a more complete understanding of the Page CRC Generator 101 operation.

CRC1 202 and CRC2 203 are CRC generating devices which compute a CRC code as data bytes applied to their inputs over bus 108. The current accumulated CRC codes in CRC1 202 and CRC2 203 are applied to their output buses 220 and 221 at all times. When enabled, CRC1 202 and CRC2 203 accumulate a new CRC code to include each newly arriving data byte on bus 108. State Control Logic 214 enables or disables CRC accumulation in CRC1 202 and CRC2 203 as well as initializes their values when appropriate to begin a new CRC code accumulation. Current accumulated CRC codes in CRC1 202 and CRC2 203 may be used as partial CRC codes for later combination with other partial CRC codes.

REG2 204 is a register used to temporarily hold the current accumulated value of CRC2 203. State Control Logic 214 causes REG2 204 to load the value of the current accumulated CRC value in CRC2 203 over bus 221. This register is used to temporarily save the CRC code accumulated in CRC2 203 so that it may initialized to accumulate another CRC code.

ENDCRC REG 209, EOPG1 REG 210, and EOPG2 REG 213 are registers similar to REG2 204 and are used to hold various final and partial CRC codes. State Control Logic 214 controls each of these registers to load the CRC code value over their input buses 226, 227 and 229 respectively. Registers ENDCRC REG 209, EOPG1 REG 210 and EOPG2 REG 213 may each hold a completed CRC code depending on State Control Logic 214 control of Page CRC Generator 101. One of these three CRC codes represents a completed CRC for a page buffer received over bus 108. When a CRC code computation is completed by Page CRC Generator 101, Control Processor 103 of FIG. 1 requests State Control Logic 214 to send the completed CRC code back over Control/Status Bus 111.

MUX 205 and MUX 206 each select one of four possible CRC codes as inputs from buses 220, 221, 222 and 227 and transmits the selected CRC code over buses 223 and 224 respectively to two inputs of CRC Combiner 207. State Control Logic 214 enables a desired selection of one of the four inputs to MUX 205 and MUX 206.

CRC Combiner 207 combines the partial CRC code on input buses 223 and 224 to produce a resulting CRC code on output bus 225. More detail of CRC Combiner 207 is discussed below with respect to FIG. 3.

MUX 208 selects one of three possible CRC codes as inputs from buses 225, 220 and 221 and transmits the selected CRC code over bus 226 to ENDCRC REG 209. State Control Logic 214 enables a desired selection of one of the three inputs to MUX 208.

MUX 212 selects one of two possible CRC codes as inputs from buses 227 and 220 and transmits the selected CRC code over bus 229 to EOPG2 REG 213. State Control Logic 214 enables a desired selection of one of the two inputs to MUX 212.

MUX 211 selects one of three possible CRC codes as inputs from buses 227, 228 and 230 and applies the selected CRC code to Control/Status Bus 111 for reading by Control Processor 103 of FIG. 1. State Control Logic 214 enables a desired selection of one of the three inputs to MUX 211 when appropriate.

PAGE SIZE 216 and HEADER SIZE 217 are registers within State Control Logic 214 loaded at power on by Control Processor 103 of FIG. 1 over Control/Status Bus 111.

COUNTER 215 is a counter within State Control Logic 214 used internally to determine when page buffers have been filled. The filling of page buffers (as described later) is a factor in computing CRC codes for the page buffer. COUNTER 215 is loaded internally by State Control Logic 214 with the value from PAGE SIZE 216 at the start of a page. It is decremented by State Control Logic 214 as each byte is received on bus 108. COUNTER 215 is decremented by the value in HEADER SIZE 217 when locations are reserved for the future receipt of a header portion of a packet (as described later). COUNTER 215 is incremented by the value in HEADER SIZE 217 when the reception of the data portion of a packet is complete and the header portion is about to arrive. These adjustments to COUNTER 215 to account for the out of order reception of a packet header portion permit Page CRC Generator 101 to accurately determine the boundaries of page buffers as they are filled. COUNTER 215 is decremented to zero when a page buffer is completely filled. This end of page condition (hereafter EOP) is used by State Control Logic 214 to control CRC computations for page buffers.

CRC Combiner

Figure 3:
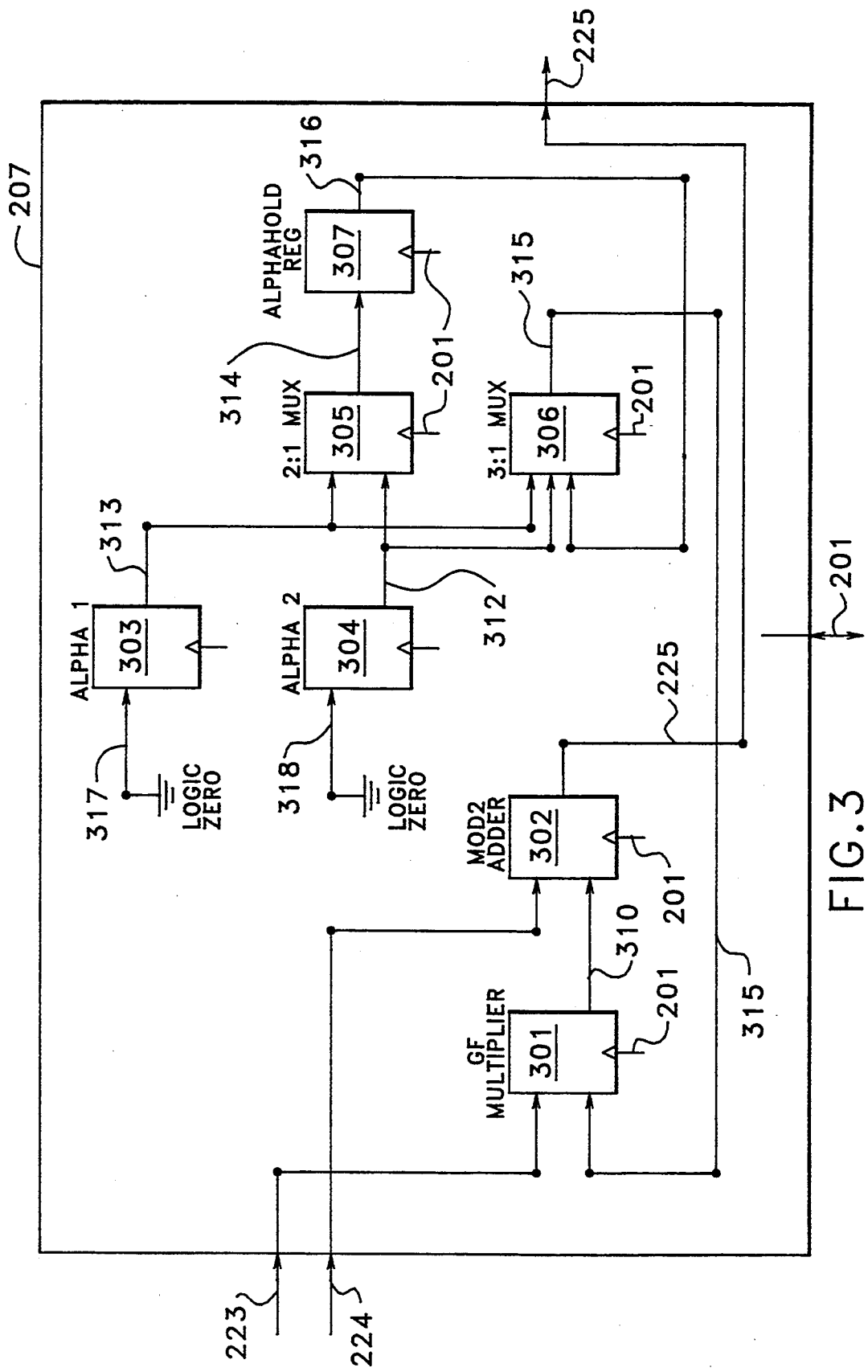
FIG. 3 shows further details of the CRC Combiner block of FIG. 2.

FIG. 3 depicts a finer level of detail for CRC Combiner 207 of FIG. 2. State Control Logic 214 of FIG. 2 controls components of FIG. 3 to cause each component to perform its function over Control Signal Bus 201.

ALPHA1 303 and ALPHA2 304 are CRC generating devices identical to CRC1 202 and CRC2 203 of FIG. 2. These devices accumulate CRC codes for data at their respective input buses 317 and 318. The current accumulated CRC codes in ALPHA1 303 and ALPHA2 304 are applied to their output buses 313 and 312 at all times. State Control Logic 214 enables or disables CRC accumulation in ALPHA1 303 and ALPHA2 304. State Control Logic 214 initializes the values of ALPHA1 303 and ALPHA2 to an initial value of one when appropriate to begin a new partial CRC computation.

Unlike CRC1 202 and CRC2 203 of FIG. 2, input buses 317 and 318 of ALPHA1 303 and ALPHA2 304 are wired to logic zero providing a zero value as input data to the CRC computation of ALPHA1 303 and ALPHA2 304. Forcing the input data to zero enables the use of the resultant CRC code in ALPHA1 303 or ALPHA2 304 in adjusting a first partial CRC code such that it may be added to a second partial CRC code. Each byte of data arriving over bus 108 of FIG. 1 causes State Control Logic 214 of FIG. 2 to clock another byte of zero input into ALPHA1 303 and ALPHA2 304. State Control Logic 214 enables either ALPHA1 303 or ALPHA2 304 to accumulate a new CRC adjustment code from its logic zero input bus when docked as described above.

MUX 305 selects one of two possible CRC codes as inputs from buses 313 and 312 and transmits the selected CRC code over bus 314 to ALPHAHOLD REG 307. ALPHAHOLD REG 307 is a register used to temporarily hold a CRC code generated by ALPHA1 303 or ALPHA2 304 for later computation.

MUX 306 selects one of three possible CRC codes as inputs from buses 312, 313 and 316 and transmits the selected CRC code over bus 315 to one operand input of GF MULTIPLIER 301. State Control Logic 214 enables a desired selection of one of the three inputs to MUX 306 when appropriate. This mux allows selection of the ALPHA1 303, ALPHA2 304 or ALPHAHOLD REG 307 CRC codes as the adjustment value to be multiplied with a partial CRC code in GF MULTIPLIER 301.

GF MULTIPLIER 301 multiples a partial CRC code on bus 223 with the CRC adjustment code applied by MUX 306 on bus 315. The product CRC produced by GF MULTIPLIER 301 on bus 310 is one operand to MOD 2 ADDER 302. The other operand for MOD 2 ADDER 302 is a partial CRC code on bus 224. MOD 2 ADDER 302 performs an addition modulo 2 on the two operands. The resultant CRC code from MOD 2 ADDER 302 is applied over bus 225 to MUX 208 of FIG. 2. The resultant CRC code is the partial CRC code on input bus 223 first multiplied by the selected CRC adjustment code on bus 315 then added modulo 2 to the second partial CRC code on input bus 224. State Control Logic 214 enables both GF MULTIPLIER 301 and MOD 2 ADDER 302 to combine partial CRC codes at their input buses.

Page Buffer Memory

FIG. 4 provides further detail as to the design of Page Buffer Memory 102. State Control Logic 411 sends and receives information to other components depicted in FIG. 1 over Control/Status Bus 111 as Page Buffer Memory 102 is filled with data. State Control Logic 411 is a finite state machine which controls other components of FIG. 4 via bus 400 to cause each component to perform its function. Operation of Page Buffer Memory 102 is more readily understood by following examples of the state machine operation of State Control Logic 411. Such examples are discussed later. First, a description of the function of each component provides an appropriate basis for a more complete understanding of Page Buffer Memory 102 operation.

Control Processor 103 of FIG. 1 loads the values of PAGE SIZE 412 and HEADER SIZE 413 over Control/Status Bus 111 into internal registers of State Control Logic 411. These values determine the control of Page Buffer Memory 102 in writing page buffers and in re-ordering data packets in real time as they are received such that the header portion of a packet, received after the data portion, will physically be written before the data portion in Page Buffer Memory 102.

DRAM ARRAY 410 is a read/write dynamic memory subsystem for storing and retrieving user data. Control Processor 103 of FIG. 1 controls State Control Logic 411 over Control/Status Bus 111 to write data into DRAM ARRAY 410 as it is received from Blocking/Compression Unit 105 of FIG. 1 or to read from DRAM ARRAY 410 and apply the data to Block Storage Device 107 of FIG. 1 over bus 110. Data into or out of DRAM ARRAY 410 is transferred over Bi-directional Data Bus 428. Status signals from Blocking/Compression Unit 105 of FIG. 1 regarding start and end of header and data portions of packets are sent to State Control Logic 411 over Control/Status Bus 111.

DRAM ARRAY 410 is logically subdivided into equal size sections called page buffers. This is a logical subdivision in the sense that there need be no physical division within the components of DRAM ARRAY 410 itself. The circuitry described below and controlled by State Control Logic 411 determines the boundaries of page buffers within DRAM ARRAY 410. Control Processor 103 determines the size of the equal size page buffer by loading PAGE SIZE 412 within State Control Logic 411 over Control/Status Bus 111.

Control Processor 103 of FIG. 1 controls Page Buffer Memory 102 over Control/Status Bus 111 to read data from DRAM ARRAY 410 and apply the data to Block Storage Device 107. State Control Logic 411 of FIG. 4 controls DATA PATH SELECTION 408 to connect data signals from Bi-directional Data Bus 428 to bus 110 to apply read data to Block Storage Device 107 of FIG. 1. State Control Logic 411 controls DRAM ARRAY 410 to enter a read mode. The initial address to be read is applied by Control Processor 103 of FIG. 1 to State Control Logic 411 of FIG. 4 over Control/Status Bus 111. State Control Logic 411 loads this initial address into DEVICE PORT ADDRESS COUNTER 407 over bus 431. In addition, State Control Logic 411 causes MUX 409 to connect input bus 426 to address bus 427 of DRAM ARRAY 410. State Control Logic 411 causes DEVICE PORT ADDRESS COUNTER 407 to increment to the next desired address as each byte is read from DRAM ARRAY 410 and applied to Block Storage Device 107 over buses 428 and 110. This read mode of operation is completed when a filled page buffer is entirely read from DRAM ARRAY 410 of FIG. 4 and applied to Block Storage Device 107 of FIG. 1.

Control Processor 103 of FIG. 1 controls Page Buffer Memory 102 over Control/Status Bus 111 to write data from bus 108 into DRAM ARRAY 410. State Control Logic 411 of FIG. 4 controls DATA PATH SELEC- TION 408 to connect data signals from Bi-directional Data Bus 428 to bus 108 to apply data read from Blocking/Compression Unit 105 of FIG. 1 to DRAM ARRAY 410. State Control Logic 411 controls DRAM ARRAY 410 to enter a writing mode.

Address generation for the writing of data to DRAM ARRAY 410 depends on various factors in State Control Logic 411. Under all such conditions, State Control Logic 411 causes MUX 409 to connect input bus 425 to address bus 427. This connection enables WORKING ADDRESS REGISTER 405 to supply addresses to be applied to DRAM ARRAY 410 as data is written to page buffers. WORKING ADDRESS REGISTER 405 is loaded with the next address selected through MUX 406 on bus 424.

One input to MUX 406 on bus 420 is the current value from PAGE START ADDRESS 401. PAGE START ADDRESS 401 is loaded by State Control Logic 411 over bus 429 with the starting address for the next page buffer to be written. This value is loaded into PAGE START ADDRESS 401 any time before the first byte arrives which needs to be written at the first byte location of the new page buffer.

The second input to MUX 406 on bus 432 is the current value from TRANSFER START ADDRESS REGISTER 403. TRANSFER START ADDRESS REGISTER 403 is loaded by State Control Logic 411 with the output of MUX 407 over bus 422. State Control Logic 411 loads TRANSFER START ADDRESS REGISTER 403 with the starting address of the first page buffer to be written at power up reset over bus 429 through MUX 407. After power up reset, State Control Logic 411 loads TRANSFER START ADDRESS REGISTER 403 over bus 423 through MUX 407 with the current value output from FUNCTION ADDER 404.

The third input to MUX 406 on BUS 423 is the current value from FUNCTION ADDER 404. FUNCTION ADDER 404 is an adder capable of adding the current values present at its two input to produce their sum on it output bus 423. FUNCTION ADDER 404 is also capable of adding a constant value of one to one of its input value on bus 421 to produce that sum on it output bus 423. FUNCTION ADDER 404 is controlled by State Control Logic 411 to perform one of these summing functions just described. The first input value to FUNCTION ADDER 404 on bus 421 is the output from MUX 414. MUX 414 is controlled by State Control Logic 411 to select from its two input buses 425 and 432. Bus 425 has the current value from WORKING ADDRESS REGISTER 405 and bus 432 has the current value from TRANSFER START ADDRESS REGISTER. The second input to FUNCTION ADDER 404 is the current value in PACKET HEADER SIZE REGISTER 402 over bus 433. PACKET HEADER SIZE REGISTER 402 is loaded at power on reset with the size of packet headers expected. State Control Logic 411 loads this value into PACKET HEADER SIZE REGISTER 402 over bus 430.

The address selected from among the three input buses of MUX 406 and the function to be performed by FUNCTION ADDER 404 depends on State Control Logic 411 and the size of data packets being received.

At the start of reception of a data packet on bus 108, FUNCTION ADDER 404 is controlled to add the value of PACKET HEADER SIZE REGISTER 402 on bus 433 to the value of TRANSFER START ADDRESS REGISTER over bus 432 through MUX 414 onto bus 421. MUX 406 is controlled to select this sum on bus 423 and apply it to bus 424 to load the sum into WORKING ADDRESS REGISTER 405. This address is the location in DRAM ARRAY 410 at which the first byte of the data portion of the packet will be written. The addition of the value in PACKET HEADER SIZE REGISTER 402 offsets the address by the size of the header portion to be received after the data portion of the packet. This reserves locations in the current page buffer to later store the header portion received out of order following the data portion of the packet.

State Control Logic 411 controls FUNCTION ADDER 404 to add a constant value of one to the current value of WORKING ADDRESS REGISTER 405 on bus 425 directed through MUX 414 onto bus 421. This sum is applied to bus 423 through MUX 406 onto bus 424 to load into WORKING ADDRESS REGISTER 405. This function effectively increments the address applied to DRAM ARRAY 410 as each byte of data is received on bus 108 and stored in DRAM ARRAY 410.

State Control Logic 411 applies the current value in PAGE START ADDRESS REGISTER 401 on bus 420 through MUX 406 onto bus 424 when the last byte of a page buffer is written with a received data byte. This value is loaded into WORKING ADDRESS REGISTER 405 to set the address applied to DRAM ARRAY 410 to the start of the next page buffer to be written. State Control Logic then resumes the incrementing of WORKING ADDRESS REGISTER 405 as described above for each subsequent byte received on bus 108. This function removes any requirement that the page buffers be physically contiguous in memory. State Control Logic 411 (at the direction of Control Processor 103 over Control/Status bus 111) determines the address of the next page buffer to be used any time during the filling of the current page buffer. The start address of the next page buffer to be used is stored into PAGE START ADDRESS REGISTER 401 by State Control Logic 411 over bus 429.

After the last byte of the data portion of the packet is received and written to DRAM ARRAY 410, State Control Logic 411 prepares to receive the packet header portion. The current value in WORKING ADDRESS REGISTER 405 has already been incremented to the address of next available location in the current page buffer as described above. This value is also applied to bus 423 as the output value of FUNCTION ADDER 404. The current value in TRANSFER START ADDRESS REGISTER is the address of locations previously reserved for the header portion of the packet about to be received on bus 108. This value is applied to bus 432 through MUX 406 onto bus 424 to load WORKING ADDRESS REGISTER 405 with the address of the locations reserved for the header portion of the packet. The value currently applied to bus 423 by FUNCTION ADDER 404 is then applied through MUX 407 onto bus 422 to load TRANSFER START ADDRESS REGISTER with the address of the next available location in the current page buffer. This address will be used as described above when the next packet arrives following the header portion of the current packet. WORKING ADDRESS REGISTER 405 is incremented as described above as each byte of the header portion of the packet is received over bus 108 and stored in DRAM ARRAY 410.

COUNTER 415 is a counter within State Control Logic 411 used internally to determine when page buffers have been filled. The filling of page buffers as described above is a factor in the address generation used to write bytes into DRAM ARRAY 410. COUNTER 415 is loaded internally by State Control Logic 411 with the value from PAGE SIZE 412 at the start of a page. It is decremented by State Control Logic 411 as each byte is received on bus 108. COUNTER 415 is decremented by the value in HEADER SIZE 413 when locations are reserved for the future receipt of a header portion of a packet (as described later). COUNTER 415 is incremented by the value in HEADER SIZE 413 when the reception of the data portion of a packet is complete and the header portion is about to arrive. These adjustments to COUNTER 415 account for the out of order reception of a packet header portion and permit State Control Logic 411 to accurately determine the boundaries of page buffers as they are filled. COUNTER 415 is decremented to zero when a page buffer is completely filled. This end of page condition (hereafter EOP) is used by State Control Logic 4 11 to control address generation at page buffers boundaries.

Operation of Page CRC Generator and Page Buffer Memory

Figure 5:
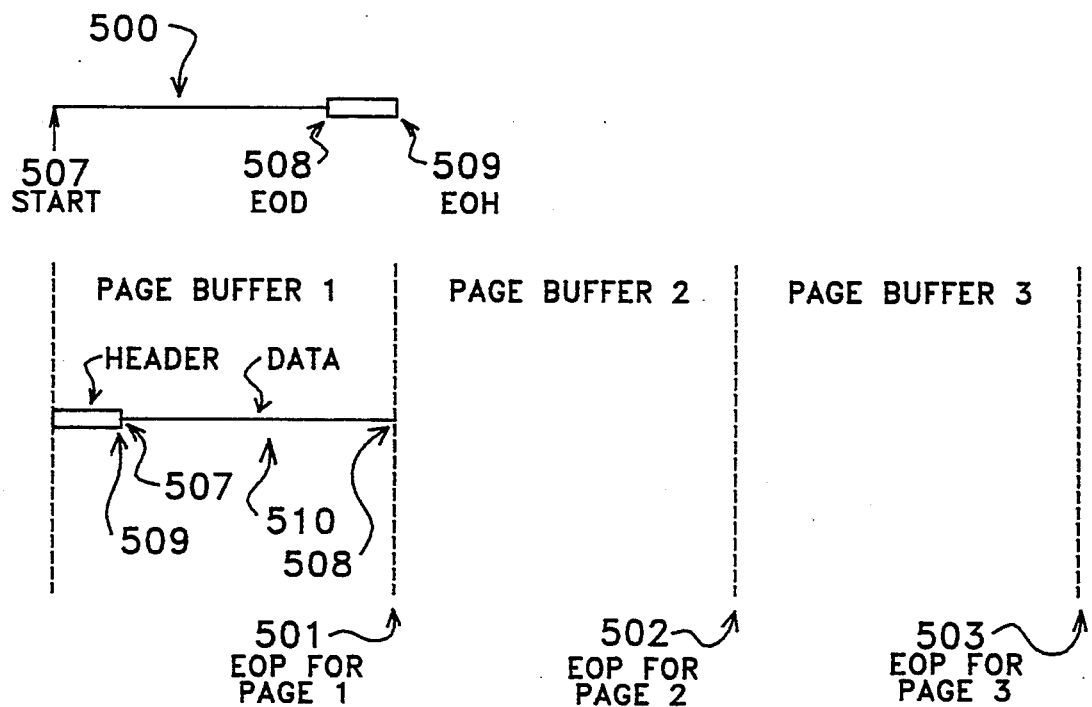
FIG. 5 is a graphical representation of an example data packet as it is received and stored into page buffer memory used to explain the operation of the finite state machine.
Figure 6:
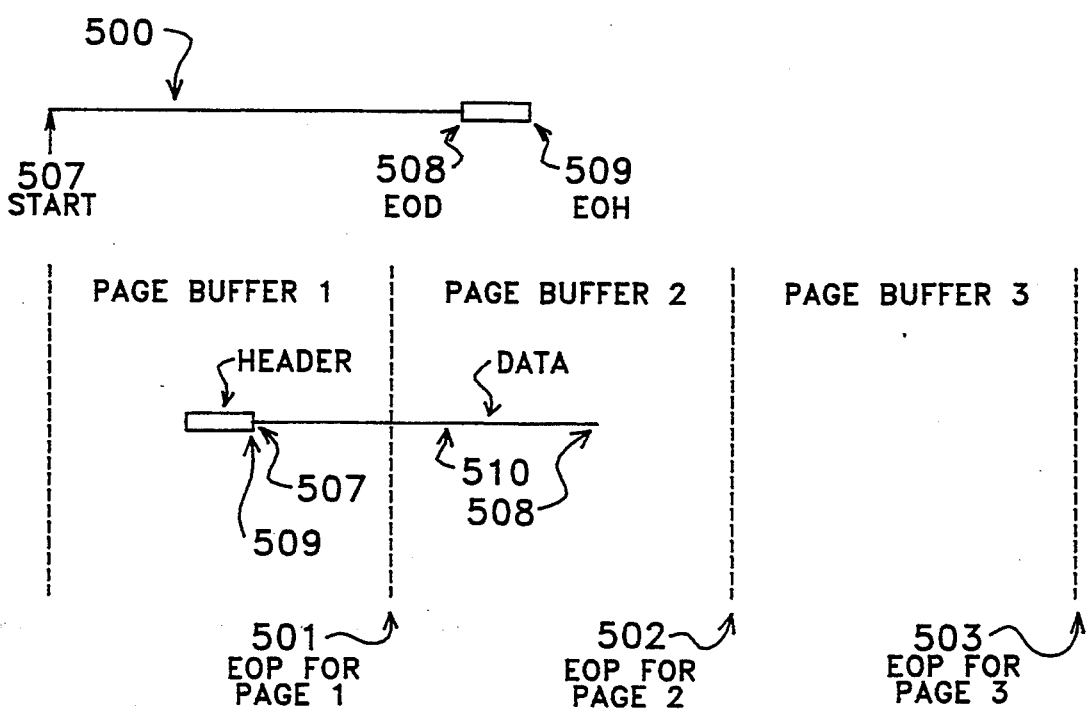
FIG. 6 is a graphical representation of another example data packet as it is received and stored into page buffer memory used to explain the operation of the finite state machine.
Figure 7:
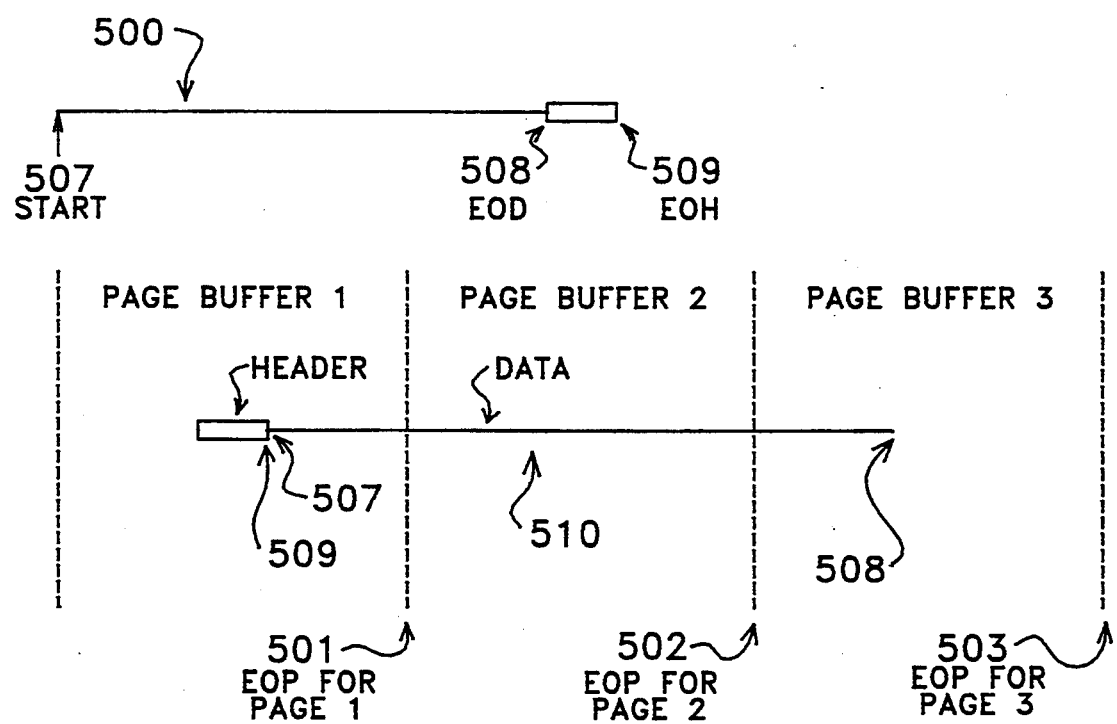
FIG. 7 is a graphical representation of another example data packet as it is received and stored into page buffer memory used to explain the operation of the finite state machine.

As noted above, the detailed operation of Page CRC Generator 101 and Page Buffer Memory 102 are more readily understood through a study of exemplary data packets. FIGS. 5-7 each show a graph representing a sequence of bytes received from Blocking/Compression Unit 105 of FIG. 1 over bus 108. In all three figures, bytes are received over bus 108 of FIG. 1 simultaneously by Page CRC Generator 101 and Page Buffer Memory 102. As each byte is received by Page Buffer Memory 102, State Control Logic 411 of FIG. 4 causes the byte to be stored in an appropriate location of DRAM ARRAY 410. In addition, each byte simultaneously received by Page CRC Generator 101 of FIG. 2 causes State Control Logic 214 to update the accumulation of a CRC code in either CRC1 202 or CRC2 203 of FIG. 2 and to update the accumulation of a CRC adjustment code in ALPHA1 303 Or ALPHA2 304 of FIG. 3 for the page buffer of Page Buffer Memory 102 being written.

Status signals between the various components of the present invention flow across Control/Status Bus 111. Blocking/Compression Unit 105 sends signals on Control/Status Bus 111 as it transmits data bytes on bus 108. These status signals related to the start and end of header and data portions of packets as they are transmitted on bus 108. Blocking/Compression Unit 105 applies a START signal on Control/Status Bus 111 when it transmits the first byte of the data portion of a packet over bus 108. An EOD signal is applied by Blocking/Compression Unit 105 on Control/Status Bus 111 when the last byte of the data portion is transmitted over bus 108. Blocking/Compression Unit 105 of similarly applies an EOH signal on Control/Status Bus 111 when the last byte of the header portion is transmitted over bus 108. State Control Logic 214 of FIG. 2 and State Control Logic 411 of FIG. 4 both sense these status signals to control page CRC generation and the storing of bytes in page buffer memory respectively.

Horizontal line 500 in FIGS. 5-7 represents a data packet received simultaneously by Page CRC Generator 101 and Page Buffer Memory 102 of FIG. 1 from Blocking/Compression Unit 105 over bus 108. The thinner part of horizontal line 500 represents the data portion of the packet transmitted out of order before the header portion represented by the thicker part of line 500. START 507 is the first byte of the data portion transmitted and is simultaneously accompanied by the application of the START signal by Blocking/Compression Unit 105 of FIG. 1 over Control/Status Bus 111. EOD 508 is the last byte of the data portion transmitted and is simultaneously accompanied by the application of the EOD signal by Blocking/Compression Unit 105 of FIG. 1 over Control/Status Bus 111. EOH 509 is the last byte of the header portion transmitted and is simultaneously accompanied by the application of the EOH signal by Blocking/Compression Unit 105 of FIG. 1 over Control/Status Bus 111.

Horizontal line 510 in FIGS. 5-7 depicts the packet represented by horizontal line 500 as it is written and restored to normal order in Page Buffer Memory 102. The leftmost position of the thinner part of horizontal line 510 represents the first byte of the data portion of a packet and is marked as START 507. The rightmost position of the thinner part of horizontal line 510 represents the last byte of the data portion of a packet and is marked as EOD 508. The leftmost part of the thicker part of horizontal line 510 represents the sequence of bytes received as the header portion arriving out of order from Blocking/Compression Unit 105 of FIG. 1 following the data portion of the data packet. The rightmost position of the thicker part of horizontal line 510 represents the last byte of the header portion of a packet and is marked EOH 509. Horizontal line 510 depicts the header portion stored in page buffer memory before the data portion.

On each of FIGS. 5-7, dashed vertical lines represent the last memory location for each of the depicted page buffers. The end of each page buffer is also the beginning of the next page buffer (if shown). The leftmost dashed vertical line represents the beginning of the first depicted page buffer (as well as the end of the prior page buffer not shown). It should be understood in FIGS. 5-7 that the labeling of page buffers as 1, 2 or 3 indicates only that these are three logically contiguous page buffers in Page Buffer Memory 102 of FIG. 1. They need not be physically contiguous nor need they be physically first, second and third page buffers within Page Buffer Memory 102. The mapping of page buffer locations to physical memory in DRAM ARRAY 410 of FIG. 4 is under the control of State Control Logic 411 when it performs address generation functions. State Control Logic 411 is further controlled by Control Processor 103 of FIG. 1 over Control/Status Bus 111. State Control Logic 214 follows the writing of bytes to page buffer memory by decrementing COUNTER 215 as each byte received is processed by the CRC generation logic. When COUNTER 215 is decremented to zero an EOP (end of page) condition arises internal to State Control Logic 214. COUNTER 215 is re-loaded with the value in PAGE SIZE 216 within State Control Logic 214 each time the EOP condition arises. Each dashed vertical line corresponds to such an EOP condition within State Control Logic 214.

For each example packet of FIGS. 5-7 described in detail below, the starting state of components in Page CRC Generator 101 and in Page Buffer Memory 102 of FIGS. 2-4 are described below. This starting state is the condition of various components for the position just preceding in time the arrival of the first data byte at START 507. Actions taken for components of FIGS. 2-4 at the various marked page buffer signals are also described. The ending state of the components of FIGS. 2-4 are described at the end of the received header portion of a packet EOH 509. This ending state of the various components of FIGS. 2-4 is the starting state for a next packet to be received from Blocking/Compression Unit 105 of FIG. 1.

Three examples are described of the finite state machine operation of State Control Logic 214 of FIG. 2 and State Control Logic 411 of FIG. 4. Other examples can be easily extrapolated from those depicted. References to the various components are with respect to FIGS. 2-4.

Example 1- FIG. 5

FIG. 5 depicts a simple example in which a packet's total size is equal to the size of a page buffer and where the packet is written to a page buffer beginning at the first location in page buffer 1.

State Control Logic 411 controls various components of Page Buffer Memory 102 prior to reception of the first data byte of the data portion of the packet as described above. FUNCTION ADDER 404 is controlled to add the value of PACKET HEADER SIZE REGISTER 402 on bus 433 to the value of TRANSFER START ADDRESS REGISTER over bus 432 through MUX 414 onto bus 421. MUX 406 is controlled to select this sum on bus 423 and apply it to bus 424 to load the sum into WORKING ADDRESS REGISTER 405. This address is the location in DRAM ARRAY 410 at which the first byte of the data portion of the packet will be written. The addition of the value in PACKET HEADER SIZE REGISTER 402 offsets the address by the size of the header portion to be received after the data portion of the packet. This reserves locations in the current page buffer to later store the header portion received out of order following the data portion of the packet. Simultaneously, State Control Logic 411 controls DATA PATH SELECTION 408 to connect bus 108 signals to Bi-directional Data Bus 428 so that bytes received from Blocking/Compression Unit 105 of FIG. 1 may be written to DRAM ARRAY 410 of FIG. 4. DRAM ARRAY 410 is controlled to a write mode to permit data to be stored in page buffers.

START 507 represents the first byte of data for the data portion of a packet transmitted from Blocking/Compression Unit 105 of FIG. 1 over bus 108. Blocking/Compression Unit 105 applies status signal START on Control/Status Bus 111 simultaneously with the transmission of the first data byte.

State Control Logic 214 of FIG. 2 initializes and enables CRC accumulation in both CRC2 203 and ALPHA2 304 to begin accumulation of a new CRC code for the data portion of this packet upon sensing the START signal on Control/Status Bus 111.

State Control Logic 411 of FIG. 4 controls DRAM ARRAY 410 to write the first byte applied to Bi-directional Data Bus 428 into the memory location specified on address bus 427. State Control Logic 411 increments WORKING ADDRESS REGISTER 405 to the next location of page buffer 1 as described above after writing the first data byte to DRAM ARRAY 410.

State Control Logic 214 of FIG. 2 causes both CRC2 203 and ALPHA2 304 to accumulate the CRC code and the CRC adjustment code corresponding to the first data byte received over bus 108. CRC2 203 computes a CRC code for the data byte received over bus 108. ALPHA2 304 computes a CRC adjustment code using a zero input from logic zero input bus 318. The ALPHA2 304 CRC code is used later to adjust another partial CRC code for combination with the CRC code accumulated in CRC2 203.

State Control Logic 214 of FIG. 2 continues to cause accumulation of CRC codes in CRC2 203 and ALPHA2 304, as described above for the first data byte, until the EOD signal is sensed on Control/Status Bus 111. State Control Logic 411 of FIG. 4 continues to cause the writing of bytes in DRAM ARRAY 410, as described above for the first data byte, until the EOD signal is sensed on Control/Status Bus 111. Blocking/Compression Unit 105 of FIG. 1 applies the EOD status signal on Control/Status Bus 111 simultaneous with the transmission of the last byte of the packet data portion over bus 108. The last byte of the data portion of the packet is represented on FIG. 5 as EOD 508.

State Control Logic 411 prepares to receive the packet header portion when the EOD signal is sensed on Control/Status Bus 111. The current value in WORKING ADDRESS REGISTER 405 has already been incremented to the address of next available location in the current page buffer as described above. This value is also applied to bus 423 as the output value of FUNCTION ADDER 404. The current value in TRANSFER START ADDRESS REGISTER is the address of locations previously reserved for the header portion of the packet about to be received on bus 108. This value is applied to bus 432 through MUX 406 onto bus 424 to load WORKING ADDRESS REGISTER 405 with the address of the locations reserved for the header portion of the packet. The value currently applied to bus 423 by FUNCTION ADDER 404 is then applied through MUX 407 onto bus 422 to load TRANSFER START ADDRESS REGISTER with the address of the next available location in the current page buffer. This address will be used as described above when the next packet arrives following the header portion of the current packet.

State Control Logic 214 of FIG. 2 disables further CRC accumulation in CRC2 203 and ALPHA2 304 when it sense the EOD signal on Control/Status Bus 111. Disabling further accumulation retains the partial CRC codes for the data portion as the header starts to arrive. State Control Logic 214 initializes and enables CRC accumulation in CRC1 202 and ALPHA1 303 to compute a new partial CRC for the header portion of the data packet independent of the CRC codes in CRC2 203 and ALPHA2 304 for the data portion.

Bytes of the header portion of the data packet are now received over bus 108 from Blocking/Compression Unit 105, stored in locations of page buffer 1 previously reserved, WORKING ADDRESS REGISTER 405 is incremented as described above after each byte is stored, and a CRC code is accumulated in CRC1 202 and ALPHA1 303 in a manner similar to that described above for the data portion until the EOH signal is sensed on Control/Status Bus 111. The EOH signal is applied by Blocking/Compression Unit 105 on Control/Status Bus 111 simultaneously with the transmission of the last byte of the header portion from Blocking/Compression Unit 105. The last byte of the header portion of the packet is depicted on FIG. 5 as EOH 509.

State Control Logic 411 of FIG. 4 resets the address generation logic to prepare for the start of a new packet data portion in page buffer 1 when it senses the EOH signal on Control/Status Bus 111. The preparation for the start of a new packet is identical to that described above for the start of the packet just completed. This ending state of Page Buffer Memory 102 is prepared for the start of a new packet to be received and stored at the location where the just completed packet ended.

State Control Logic 214 of FIG. 2 disables further CRC accumulation in CRC1 202 and completes the CRC computations for page buffer 1 when the EOH signal is sensed on Control/Status Bus 111. The CRC code accumulated in CRC1 202 represents the partial CRC code for the header portion of the received data packet. The CRC code accumulated in CRC1 202 is applied over bus 220 through MUX 205 to one input of GF MULTIPLIER 301 of FIG. 3 on bus 223. The CRC code in CRC2 203 is applied over bus 221 through MUX 206 to one input of MOD 2 ADDER 302 of FIG. 3 on bus 224. The CRC adjustment value accumulated in ALPHA2 304 is applied over bus 312 through MUX 306 to the lower input of GF MULTIPLIER 301 on bus 315. GF MULTIPLIER 301 is controlled to apply the adjusted product of CRC1 202 and ALPHA 2 304 to bus 310. MOD 2 ADDER 302 is then controlled to sum the adjusted product CRC code on bus 310 with CRC2 203 on bus 224 and apply the sum to bus 225. This combined CRC representing the completed CRC code for page buffer 1 on bus 225 is then applied through MUX 208 over bus 226 to ENDCRC REG 209. This complete CRC code is applied over bus 227, through MUX 211 and over Control/Status Bus 111 to Control Processor 103 of FIG. 1.

This completes the CRC computations and data storage for this example. This example packet ends at the last location of page buffer 1 exactly filling the page buffer leaving no residual partial packet remaining in page buffer 1. Since there is no residual data filling part of a page buffer, there is no need for saving a corresponding partial CRC code in preparation for the next packet to be received. Another packet may begin on the next page buffer and does not require a partial CRC code as a starting state for it CRC computations.

Example 2- FIG. 6

FIG. 6 depicts a somewhat more complex example in which the data packet is written to the page buffer beginning in the middle of page buffer 1. Packets received before the current packet have been previously written at the start of page buffer 1. A partial CRC code for these prior packets was previously computed and is saved in ENDCRC REG 209. This partial CRC code is later combined with partial CRC codes accumulated for the current packet's header and data portions to complete the CRC computation for page buffer 1.

The current data packet also extends past the end of page buffer 1 and is stored in part of page buffer 2. A partial CRC code for the portion of the current packet written in page buffer 2 is saved in ENDCRC REG 209 at the end of processing this example. This partial CRC code is later combined with partial CRC codes when the next packet is received to create a complete CRC code for page buffer 2.

State Control Logic 411 controls various components of Page Buffer Memory 102 prior to reception of the first data byte of the data portion of the packet as described above. FUNCTION ADDER 404 is controlled to add the value of PACKET HEADER SIZE REGISTER 402 on bus 433 to the value of TRANSFER START ADDRESS REGISTER over bus 432 through MUX 414 onto bus 421. MUX 406 is controlled to select this sum on bus 423 and apply it to bus 424 to load the sum into WORKING ADDRESS REGISTER 405. This address is the location in DRAM ARRAY 410 at which the first byte of the data portion of the packet will be written. The addition of the value in PACKET HEADER SIZE REGISTER 402 offsets the address by the size of the header portion to be received after the data portion of the packet. This reserves locations in the current page buffer to later store the header portion received out of order following the data portion of the packet. Simultaneously, State Control Logic 411 controls DATA PATH SELECTION 408 to connect bus 108 signals to Bi-directional Data Bus 428 so that bytes received from Blocking/Compression Unit 105 of FIG. 1 may be written to DRAM ARRAY 410 of FIG. 4. DRAM ARRAY 410 is controlled to a write mode to permit data to be stored in page buffers.

START 507 of FIG. 6 represents the first byte of data for the data portion of a packet transmitted from Blocking/Compression Unit 105 of FIG. 1 over bus 108. Blocking/Compression Unit 105 applies status signal START on Control/Status Bus 111 simultaneously with the transmission of the first data byte.

State Control Logic 214 of FIG. 2 initializes and enables CRC accumulation in CRC2 203 and ALPHA2 304 when it senses the START signal on Control/Status Bus 111. This begins accumulation of a new CRC code for the data portion of this packet.

State Control Logic 411 of FIG. 4 controls DRAM ARRAY 410 to write the first byte applied to Bi-directional Data Bus 428 into the memory location specified on address bus 427. State Control Logic 411 increments WORKING ADDRESS REGISTER 405 to the next location of page buffer 1 as described above after writing the first data byte to DRAM ARRAY 410.

State Control Logic 214 causes both CRC2 203 and ALPHA2 304 to accumulate the CRC code and the CRC adjustment code corresponding to the first data byte received over bus 108. CRC2 203 computes a CRC code for the data byte received over bus 108. ALPHA2 304 computes a CRC adjustment code using a zero input from logic zero input bus 318. The ALPHA2 304 CRC code is used later to adjust another partial CRC code for combination with the CRC code accumulated in CRC2 203.

State Control Logic 214 of FIG. 2 continues to cause accumulation of CRC codes in CRC2 203 and ALPHA2 304 as described above for the first data byte until the EOP condition is sensed when COUNTER 215 is decremented to zero. State Control Logic 411 of FIG. 4 continues to cause the storing of bytes in DRAM ARRAY 410 as described above for the first data byte until the EOP condition is sensed when COUNTER 415 is decremented to zero. The last location in page buffer 1 is depicted in FIG. 6 as EOP FOR PAGE 1 501.

State Control Logic 214 of FIG. 2 disables further CRC accumulation in CRC2 203 and ALPHA2 304 upon sensing the EOP condition when COUNTER 215 is decremented to zero. These partial CRC codes are saved to be combined with other partial CRC codes later when the header portion of the data packet is received. State Control Logic 214 of FIG. 2 loads the CRC code in CRC2 203 into REG2 204 over bus 221 and loads the CRC adjustment code in ALPHA2 304 on bus 312 through MUX 305, over bus 314, into AL- PHAHOLD REG 307. These values are saved so that CRC2 203 and ALPHA2 304 may be re-used in later CRC accumulation before their partial CRC codes can be used to complete the CRC computations for page buffer 1. State Control Logic 214 simultaneously initializes and enables CRC1 202 and ALPHA1 303 to begin accumulating a CRC code for page buffer 2.

There are now two partial CRC codes computed for page buffer 1. Both partial CRC codes must await receipt of the header portion of the current packet to complete CRC computations for page buffer 1. ENDCRC REG 209 holds one partial CRC code for all the data which preceded the current packet in page buffer 1. REG2 204 together with ALPHAHOLD 307 holds the other partial CRC code and CRC adjustment code for the data received thus far for the current packet and written in page buffer 1. The completion of the CRC computations for page buffer 1 must still await the reception of the header portion of the current data packet.

State Control Logic 411 applies the current value in PAGE START ADDRESS REGISTER 401 on bus 420 through MUX 406 onto bus 424 to load into WORKING ADDRESS REGISTER 405 when it senses its EOP condition. This new address value is the location of the start of page buffer 2, the next page buffer to be filled. This address is determined by Control Processor 103 of FIG. 1 and is loaded into PAGE START ADDRESS REGISTER 401 over Control/Status Bus 111 by State Control Logic 411 on bus 429. This address was previously loaded any time during the filling of page buffer 1.

Receipt of bytes of the data portion of the current packet continues and the bytes are now being written to locations in page buffer 2. State Control Logic 411 continues to increment WORKING ADDRESS REGISTER 405 as further packet data portion bytes are received over bus 108. The addresses so generated to DRAM ARRAY 410 over address bus 427 now cause bytes to be written into location of page buffer 2.

State Control Logic 214 of FIG. 2 continues to cause accumulation of CRC codes in CRC1 202 and ALPHA1 303 as described above for the earlier parts of the packet data portion until it senses the EOD signal on Control/Status Bus 111. State Control Logic 411 of FIG. 4 continues to cause the storing of bytes in DRAM ARRAY 410 as described above for the earlier parts of the packet data portion until it senses the EOD signal on Control/Status Bus 111. The last byte of the data portion transmitted from Blocking/Compression Unit 105 of FIG. 1 is accompanied by the simultaneous application of the EOD signal on Control/Status Bus 111 by Blocking/Compression Unit 105. The last byte of the data portion of the packet is represented on FIG. 6 as EOD 508.

State Control Logic 411 prepares to receive the packet header portion when the EOD signal is sensed on Control/Status Bus 111. The current value in WORKING ADDRESS REGISTER 405 has already been incremented to the address of next available location in page buffer 2 as described above. This value is also applied to bus 423 as the output value of FUNCTION ADDER 404. The current value in TRANSFER START ADDRESS REGISTER is the address of locations previously reserved for the header portion of the packet about to be received on bus 108. This value is applied to bus 432 through MUX 406 onto bus 424 to load WORKING ADDRESS REGISTER 405 with the address of the locations reserved for the header portion of the packet. The value currently applied to bus 423 by FUNCTION ADDER 404 is then applied through MUX 407 onto bus 422 to load TRANSFER START ADDRESS REGISTER with the address of the next available location in the current page buffer. This address will be used as described above when the next packet arrives following the header portion of the current packet.

State Control Logic 214 of FIG. 2 disables further CRC accumulation in CRC1 202 and ALPHA1 303 when it senses the EOD signal on Control/Status Bus 111. Disabling further accumulation retains the partial CRC codes for the data portion thus far received and stored in page buffer 2 as the header portion starts to arrive. Simultaneously, State Control Logic 214 of FIG. 2 initializes and enables CRC accumulation in CRC2 203 and ALPHA2 304 to compute a new CRC for the header portion of the data packet independent of the CRC codes in CRC1 202 and ALPHA1 303 for the data portion in page buffer 2 and independent of the partial CRC codes for page buffer 1 saved in ENDCRC REG 209, REG2 204 and ALPHAHOLD REG 307.

Bytes of the header portion of the data packet are now received over bus 108 from Blocking/Compression Unit 105, written to locations of page buffer 1 previously reserved for the header portion, WORKING ADDRESS REGISTER 405 is incremented as described above after each byte is stored, and a CRC code is accumulated in CRC2 203 and ALPHA2 304 in a manner similar to that described above for the data portion. Blocking/Compression Unit 105 of FIG. 1 applies the EOH signal to Control/Status Bus 111 simultaneous with the transmission of the last byte of the header portion. The last byte of the header portion of the packet is depicted on FIG. 6 as EOH 509.

State Control Logic 411 of FIG. 4 resets the address generation logic to prepare for the start of a new packet data portion in page buffer 1 when it senses the EOH signal on Control/Status Bus 111. The preparation for the start of a new packet is identical to that described above for the start of the packet just completed. This ending state of Page Buffer Memory 102 is prepared for the start of a new packet to be received and stored where the just completed packet ended in page buffer 2.

State Control Logic 214 of FIG. 2 disables further CRC accumulation in CRC2 203 and ALPHA2 304 and completes the CRC computations for page buffer 1 when the EOH signal is sensed on Control/Status Bus 111. To complete CRC computations for page buffer 1, State Control Logic 214 of FIG. 2 applies the CRC2 203 value over bus 221, through MUX 206, to an input of MOD 2 ADDER 302 on bus 224. Next the partial CRC code from the earlier packets in page buffer 1, saved in ENDCRC REG 209, is applied to bus 227, through MUX 205, to an input of GF MULTIPLIER 301 on bus 223. The CRC adjustment code in ALPHA2 304 is applied to bus 312, through MUX 306, to the lower input to GF MULTIPLIER 301 on bus 315. GF MULTIPLIER 301 is controlled to apply resultant CRC code to bus 310 as a second input to MOD 2 ADDER 302. MOD 2 ADDER 302 is controlled to produce a further partial CRC code and apply it to bus 225. This further partial CRC for page buffer 1 is now adjusted to combine the partial CRC codes for the prior data from page buffer 1 and the partial CRC code for the new packet header. This adjusted partial CRC code is applied to bus 225, through MUX 208, to ENDCRC REG 209 on bus 226, then over bus 227, through MUX 205, to one input of GF MULTIPLIER 301 on bus 223. The partial CRC code from the data portion of this packet stored in page buffer 1 was previously saved in REG2 204. This partial CRC code is applied to bus 222, through MUX 206, to one input of MOD 2 ADDER 302 on bus 224. The CRC adjustment value saved in ALPHAHOLD REG 307 is applied to bus 316, through MUX 306, to the lower input of GF MULTIPLIER 301 on bus 315. GF MULTIPLIER 301 is then controlled to apply its resultant CRC code to bus 310 as a second input to MOD 2 ADDER 302. MOD 2 ADDER 302 is controlled to apply the final CRC code for page buffer 1 to bus 225. This final CRC code for page buffer 1 on bus 225 is then applied through MUX 208, to ENDCRC REG 209 on bus 226, then over bus 227, to EOPG1 REG 210. This final CRC code is then applied through MUX 211 to Control/Status Bus 111 for reading by Control Processor 103 of FIG. 1 as the completed CRC code for page buffer 1.

The partial CRC code for data portion of this packet written in page buffer 2 is currently in CRC1 202. This partial CRC code is applied over bus 220, through MUX 208, to ENDCRC REG 209 on bus 226. This partial CRC code for page buffer 2 is left as an ending state of Page CRC Generator 101 and the starting state for another packet yet to be received. This represents the same state found at the start of the description of this example FIG. 6.

This completes the CRC computations and data storage for this example. As described above, the ending state of Page CRC Generator 101 and Page Buffer Memory 102 of FIG. 1 in this example is the same as the starting state expected for this example. The packet ends with some bytes from its data portion in page buffer 2. The address generation logic of State Control Logic 411 of FIG. 4 has been left in a state in which it is prepared to continue storing the next packet of data in page buffer 2 where this packet left off. Locations are reserved in page buffer 2 for the header portion of the next packet. The partial CRC code for the data stored in page buffer 2 is left in ENDCRC REG 209 enabling State Control Logic 214 of FIG. 2 to continue CRC computations for page buffer 2. These conditions are identical to the starting state required at the start of this example.

Example 3- FIG. 7

As in the previous example, FIG. 7 depicts an example in which the data packet is written to the page buffer beginning in the middle of page buffer 1. Packets received before the current packet are written at the start of page buffer 1. A partial CRC code for these prior packets is saved in ENDCRC REG 209. This partial CRC code is later combined with partial CRC codes accumulated for the current packet header and data portions to complete the CRC computation for page buffer 1.

The current data packet also extends past the end of page buffer 1 and is stored in part of page buffer 2. A partial CRC code for the portion of the current packet written in page buffer 2 is saved in ENDCRC REG 209 when all data of the current packet is written to page buffer 1 and page buffer 2. This partial CRC code is combined with partial CRC code when the next packet is received to create a complete CRC code for page buffer 2.

FIG. 7 depicts one more complexity as an example of State Control Logic 214 operation. The packet in this example is large enough that the data portion spans the entire length of page buffer 2. State Control Logic 214 computes a complete CRC code for the data bytes written in page buffer 2. This CRC code is a final CRC code which need not be combined with partial CRC codes for a page buffer.

Though the example of FIG. 7 depicts only one such full page buffer spanned it could as easily span any number of full page buffers utilizing the same logic. This capability permits packets to vary in size independent of the selected page buffer size.

State Control Logic 411 controls various components of Page Buffer Memory 102 prior to reception of the first data byte of the data portion of the packet as described above. FUNCTION ADDER 404 is controlled to add the value of PACKET HEADER SIZE REGISTER 402 on bus 433 to the value of TRANSFER START ADDRESS REGISTER over bus 432 through MUX 414 onto bus 421. MUX 406 is controlled to select this sum on bus 423 and apply it to bus 424 to load the sum into WORKING ADDRESS REGISTER 405. This address is the location in DRAM ARRAY 410 at which the first byte of the data portion of the packet will be written. The addition of the value in PACKET HEADER SIZE REGISTER 402 offsets the address by the size of the header portion to be received after the data portion of the packet. This reserves locations in page buffer 1 to later store the header portion received out of order following the data portion of the packet. Simultaneously, State Control Logic 411 controls DATA PATH SELECTION 408 to connect bus 108 signals to Bi-directional Data Bus 428 so that bytes received from Blocking/Compression Unit 105 of FIG. 1 may be written to DRAM ARRAY 410 of FIG. 4. DRAM ARRAY 410 is controlled to a write mode to permit data to be stored in page buffers.

START 507 represents the first byte of data for the data portion of a packet transmitted from Blocking/Compression Unit 105 of FIG. 1 over bus 108. Blocking/Compression Unit 105 applies status signal START on Control/Status Bus 111 simultaneously with the transmission of the first data byte.

State Control Logic 214 of FIG. 2 initializes and enables CRC accumulation in CRC2 203 and ALPHA2 304 to begin accumulation of a new CRC code for the data portion of this packet upon sensing the START signal on Control/Status Bus 111.

State Control Logic 411 of FIG. 4 controls DRAM ARRAY 410 to write the first byte applied to Bi-directional Data Bus 428 into the memory location specified on address bus 427. State Control Logic 411 increments WORKING ADDRESS REGISTER 405 to the next location of page buffer 1 as described above after writing the first data byte to DRAM ARRAY 410.

State Control Logic 214 of FIG. 2 causes both CRC2 203 and ALPHA2 304 to accumulate the CRC code and the CRC adjustment code corresponding to the first data byte received over bus 108. CRC2 203 computes a CRC code for the data byte received over bus 108. ALPHA2 304 computes a CRC adjustment code using a zero input from logic zero input bus 318. The ALPHA2 304 CRC code is used later to adjust another partial CRC code for combination with the CRC code accumulated in CRC2 203.

State Control Logic 214 of FIG. 2 continues to cause accumulation of CRC codes in CRC2 203 and AL- PHA2 304 as described above for the first data byte until the EOP condition is sensed when COUNTER 215 is decremented to zero. State Control Logic 411 of FIG. 4 continues to cause the storing of bytes in DRAM ARRAY 410 as described above for the first data byte until the EOP condition is sensed when COUNTER 415 is decremented to zero. The last location in page buffer 1 is depicted in FIG. 7 as EOP FOR PAGE 1 501.

State Control Logic 214 of FIG. 2 disables the further CRC accumulation in CRC2 203 and ALPHA2 304 upon sensing the EOP condition when COUNTER 215 is decremented to zero. These partial CRC codes are saved to be combined with other partial CRC codes later when the header portion of the data packet is received. State Control Logic 214 loads the CRC code in CRC2 203 into REG2 204 over bus 221 and loads the CRC adjustment code in ALPHA2 304 on bus 312 through MUX 305 into ALPHAHOLD REG 307 over bus 314. These values are saved so that CRC2 203 and ALPHA2 304 may be re-used in later CRC accumulation before their partial CRC codes can be used to complete the CRC computations for page buffer 1. State Control Logic 214 simultaneously initializes and enables CRC1 202 and ALPHA1 303 to begin accumulating a CRC code for page buffer 2.

There are now two partial CRC codes computed for page buffer 1. Both partial CRC codes must await receipt of the header portion of the current packet to complete CRC computations for page buffer 1. ENDCRC REG 209 holds one partial CRC code for all the data which preceded the current packet in page buffer 1. REG2 204 together with ALPHAHOLD 307 holds the other partial CRC code and CRC adjustment code for the data received thus far for the current packet and written in page buffer 1. The completion of the CRC computations for page buffer 1 must still await the reception of the header portion of the current data packet.

State Control Logic 411 applies the current value in PAGE START ADDRESS REGISTER 401 on bus 420 through MUX 406 onto bus 424 to load into WORKING ADDRESS REGISTER 405 when it first sense its EOP condition. This new address value is the location of the start of page buffer 2, the next page buffer to be filled. This address is determined by Control Processor 103 of FIG. 1 and is loaded into PAGE START ADDRESS REGISTER 401 over Control/Status Bus 111 by State Control Logic 411 on bus 429. This address was previously loaded any time during the filling of page buffer 1.

Receipt of bytes of the data portion of the current packet continues and the bytes are now being written to locations in page buffer 2. State Control Logic 411 continues to increment WORKING ADDRESS REGISTER 405 as described above as further packet data portion bytes are received over bus 108. The addresses so generated to DRAM ARRAY 410 over address bus 427 now cause bytes to be written into location of page buffer 2.

State Control Logic 214 of FIG. 2 continues to cause accumulation of CRC codes in CRC1 202 and ALPHA1 303 as described above for the earlier parts of the packet data portion until the EOP condition is again sensed when COUNTER 215 decrements to zero. State Control Logic 411 of FIG. 4 continues to cause the storing of bytes in DRAM ARRAY 410 as described above for the earlier parts of the packet data portion until the EOP condition is again sensed when COUNTER 405 is decremented to zero. The last location in page buffer 2 is depicted in FIG. 7 as EOP FOR PAGE 2 502.

State Control Logic 214 of FIG. 2 disables further CRC accumulation in CRC1 202 and ALPHA1 303 when it sense the EOP condition when COUNTER 215 decrements to zero. This CRC code is a complete CRC code for page buffer 2 and there is no need to adjust or combine the CRC value in CRC1 202 with any saved partial CRC codes. State Control Logic 214 next initializes and enables CRC accumulation in CRC2 203 and ALPHA2 304 as bytes are stored in page buffer 3.

The complete CRC code for page buffer 2 now in CRC1 202 is applied over bus 220, through MUX 212, over bus 229 to EOPG2 REG 213, then over bus 230, through MUX 211, to Control/Status Bus 111. The complete CRC code for page buffer 2 is available for reading by Control Processor 103 of FIG. 1 on Control/Status Bus 111.

State Control Logic 411 applies the current value in PAGE START ADDRESS REGISTER 401 on bus 420 through MUX 406 onto bus 424 to load into WORKING ADDRESS REGISTER 405 when it again sense its EOP condition. This new address value is the location of the start of page buffer 3, the next page buffer to be filled. This address is determined by Control Processor 103 of FIG. 1 and is loaded into PAGE START ADDRESS REGISTER 401 over Control/Status Bus 111 by State Control Logic 411 on bus 429. This address was previously loaded any time during the filling of page buffer 2.

Receipt of bytes of the data portion of the current packet continues and the bytes are now being written to locations in page buffer 3. State Control Logic 411 continues to increment WORKING ADDRESS REGISTER 405 as described above as further packet data portion bytes are received over bus 108. The addresses so generated to DRAM ARRAY 410 over address bus 427 now cause bytes to be written into location of page buffer 3.

State Control Logic 214 of FIG. 2 continues to cause accumulation of CRC codes in CRC2 203 and ALPHA2 304 as described above for the earlier parts of the packet data portion until the EOD signal is sensed on Control/Status Bus 111. State Control Logic 411 of FIG. 4 continues to cause the storing of bytes in DRAM ARRAY 410 as described above for the earlier parts of the packet data portion until the EOD signal is sensed on Control/Status Bus 111. The last byte of the data portion transmitted from Blocking/Compression Unit 105 of FIG. 1 is accompanied by the simultaneous application of the EOD signal on Control/Status Bus 111. The last byte of the data portion of the packet is represented on FIG. 7 as EOD 508.

State Control Logic 411 prepares to receive the packet header portion when the EOD signal is sensed on Control/Status Bus 111. The current value in WORKING ADDRESS REGISTER 405 has already been incremented to the address of next available location in page buffer 3 as described above. This value is also applied to bus 423 as the output value of FUNCTION ADDER 404. The current value in TRANSFER START ADDRESS REGISTER is the address of locations previously reserved for the header portion of the packet about to be received on bus 108. This value is applied to bus 432 through MUX 406 onto bus 424 to load WORKING ADDRESS REGISTER 405 with the address of the locations reserved for the header portion of the packet. The value currently applied to bus 423 by FUNCTION ADDER 404 is then applied through MUX 407 onto bus 422 to load TRANSFER START ADDRESS REGISTER with the address of the next available location in page buffer 3. This address will be used as described above when the next packet arrives following the header portion of the current packet.

State Control Logic 214 of FIG. 2 disables further CRC accumulation in CRC2 203 and ALPHA2 304 when it senses the EOD signal on Control/Status Bus 111. Disabling further accumulation retains the partial CRC codes for the data portion thus far received and stored in page buffer 3 as the header portion starts to arrive. Simultaneously, State Control Logic 214 of FIG. 2 initializes and enables CRC accumulation in CRC1 202 and ALPHA1 303 to compute a new CRC for the header portion of the data packet independent of the CRC codes in CRC2 203 and ALPHA2 304 for the data portion in page buffer 3 and independent of the partial CRC codes for page buffer 1 saved in ENDCRC REG 209, REG2 204 and ALPHAHOLD REG 307.

Bytes of the header portion of the data packet are now received over bus 108 from Blocking/Compression Unit 105, written to locations of page buffer 1 previously reserved for the header portion, WORKING ADDRESS REGISTER 405 is incremented as described above after each byte is stored, and a CRC code is accumulated in CRC1 202 and ALPHA1 303 in a manner similar to that described above for the data portion. Blocking/Compression Unit 105 of FIG. 1 applies the EOH signal to Control/Status Bus 111 simultaneous with the transmission of the last byte of the header portion. The last byte of the header portion of the packet is depicted on FIG. 7 as EOH 509.

State Control Logic 411 of FIG. 4 resets the address generation logic to prepare for the start of a new packet data portion in page buffer 3 when it senses the EOH signal on Control/Status Bus 111. The preparation for the start of a new packet is identical to that described above for the start of the packet just completed. This ending state of Page Buffer Memory 102 is prepared for the start of a new packet to be received and stored at the location where the just completed packet ended in page buffer 3.

State Control Logic 214 of FIG. 2 disables further CRC accumulation in CRC1 202 and ALPHA1 303 and completes the CRC computations for page buffer 1 when it senses the EOH signal on Control/Status Bus 111. To complete CRC computations for page buffer 1, State Control Logic 214 of FIG. 2 applies the value in CRC1 202 over bus 220, through MUX 206, to an input of MOD 2 ADDER 302 on bus 224. Next the partial CRC code saved in ENDCRC REG 209 from the earlier packets in page buffer 1 is applied over bus 227, through MUX 205, to an input of GF MULTIPLIER 301 on bus 223. The CRC adjustment code in ALPHA1 303 is applied over bus 3 13, through MUX 306, to the lower input to GF MULTIPLIER 301 on bus 315. GF MULTIPLIER 301 is controlled to apply resultant CRC code to bus 310 as the second input to MOD 2 ADDER 302. MOD 2 ADDER 302 is controlled to produce a further partial CRC code and apply it to bus 225. This further partial CRC for page buffer 1 is now adjusted to combine the partial CRC codes for the prior data from page buffer 1 and the partial CRC code for the new packet header. This adjusted partial CRC code is applied to bus 225, through MUX 208, to ENDCRC REG 209 on bus 226, then over bus 227, through MUX 205, to one input of GF MULTIPLIER 301 over bus 223. The partial CRC code from the data portion of this packet stored in page buffer 1 was previously saved in REG2 204. This partial CRC code is applied to bus 222, through MUX 206, to one input of MOD 2 ADDER 302 on bus 224. The CRC adjustment value saved in ALPHAHOLD REG 307 is applied to bus 316, through MUX 306, to the lower input of GF MULTIPLIER 301 on bus 315. GF MULTIPLIER 301 is then controlled to apply its resultant CRC code to bus 310 as a second input to MOD 2 ADDER 302. MOD 2 ADDER 302 is controlled to apply the final CRC code for page buffer 1 to bus 225. This final CRC code for page buffer 1 on bus 225 is then applied through MUX 208, to ENDCRC REG 209 on bus 226, then over bus 227, to EOPG1 REG 210. This final CRC code is then applied on bus 228, through MUX 211, to Control/Status Bus 111 for reading by Control Processor 103 of FIG. 1 as the completed CRC code for page buffer 1.

The partial CRC code for data portion of this packet written in page buffer 3 is currently in CRC2 203. This partial CRC code is applied over bus 221, through MUX 208, to ENDCRC REG 209 on bus 226. This partial CRC code for page buffer 3 is left as an ending state of Page CRC Generator 101 and the starting state for another packet yet to be received. This represents the same state found at the start of the description of this example FIG. 7.

This completes the CRC computations and data storage for this example. As described above, the ending state of Page CRC Generator 101 and Page Buffer Memory 102 of FIG. 1 in this example is the same as starting state expected for this example. The packet ends with some bytes from its data portion in page buffer 3. The address generation logic of State Control Logic 411 of FIG. 4 has been left in a state in which it is prepared to continue storing the next packet of data in locations of page buffer 3 where this packet left off. Locations are reserved in page buffer 3 for the header portion of the next packet. The partial CRC code for the data stored in page buffer 3 is left in ENDCRC REG 209 enabling State Control Logic 214 of FIG. 2 to continue CRC computations for page buffer 3. These conditions are identical to the starting state required at the start of this example.

It is expressly understood that the claimed invention is not to be limited to the description of the preferred embodiment but encompasses other modifications and alterations within the scope and spirit of the inventive concept.

We claim:

1. Apparatus for generating a final CRC code over a fixed size block of data as said block of data is received from a transmission source, said block of data comprising a header portion received from said transmission source subsequent to reception of a data portion from said transmission source, said apparatus comprising:

data CRC generation means for generating a data CRC code in response to said reception of said data portion from said transmission source;

header CRC generation means for generating a header CRC code in response to said reception of said header portion from said transmission source; and CRC combiner means, responsive to generation of said data CRC code and to generation of said header CRC code, for generating said final CRC code representing a CRC code corresponding to said data block arranged inverse to the order of said reception of said data portion and said header portion.

2. Apparatus of claim 1 wherein said CRC combiner means further comprises:
- CRC adjustment means for accumulating an adjustment CRC value used to adjust a said data CRC code or a said header CRC code;
- Galois Field multiplier means for multiplying a said data CRC code or a said header CRC code by a said adjustment CRC value to create an adjusted CRC code; and
- Modulo 2 adder means for adding a said adjusted CRC code to a said header CRC code or to a said data CRC code to create a final CRC code.

3. Apparatus for receiving variable length data packets from a transmission source, said data packets comprising a header portion received subsequent to a data portion, storing said data packets in fixed size buffers while generating a first CRC code over data stored in said fixed size buffers, transferring data from said fixed size buffers to a block storage device while generating a second CRC code over said data of said fixed size buffers, and comparing said first and second CRC codes to detect an error, said apparatus comprising:
- page buffer memory means comprising a plurality of equal size memory page buffers for storing and retrieving data;
- means for applying said data packets to said page buffer memory means;
- ordering means including said page buffer memory means for storing said data packets in said page buffer memory means arranged inverse to the order of reception with said header portion preceding said data portion;
- page CRC generation means for generating a CRC code over data stored in said page buffer memory means in in response to reception of said data packets from said transmission source;
- CRC saving means for recording CRC codes generated by said page CRC generation means;
- transfer means for transferring data from said page buffer memory means to said block storage device;
- CRC checking means responsive to said transfer means for accumulating a check CRC code as data is transferred from said page buffer memory means to said block storage device; and
- control processor means for controllably causing said transfer means to transfer data from said page buffer memory means to said block storage device, said control processor means being further adapted to cause said CRC saving means to record a CRC code generated by said page CRC generation means, said control processor being further adapted to compare said recorded CRC code with said check CRC code to determine that said data was successfully transferred to said block storage device from said page buffer memory means by said transfer means.

4. Apparatus of claim 3 wherein each of said plurality of equal size page buffers comprise a number of locations less than the number of bytes in the largest of said data packets such that a single said data packet may be stored in multiple of said page buffers.

5. Apparatus of claim 3 wherein said page CRC generation means comprises:
- data CRC generation means for accumulating a data CRC code over bytes of said remaining data portion in real time as said bytes are received from said transmission source;
- header CRC generation means for accumulating a header CRC code over bytes of said header portion in real time as said bytes are received from said transmission source; and
- CRC combiner means for combining said header CRC code and said data CRC code to produce a resulting CRC code equal to a CRC code accumulated over bytes of said header portion and said remaining data portion as though said bytes had been received in correct sequential order.

6. Apparatus of claim 5 wherein said CRC combiner means further comprises:
- CRC adjustment means for accumulating an adjustment CRC value used to adjust a said data CRC code or a said header CRC code;
- Galois Field multiplier means for multiplying a said data CRC code or a said header CRC code by a said adjustment CRC value to create an adjusted CRC code; and
- modulo 2 adder means for adding a said adjusted CRC code to a said header CRC code or to a said data CRC code to create a final CRC code.

7. A method for generating a final CRC code over data packets comprising a header portion received subsequent to reception of a data portion, said method comprising the steps of:
- generating a data CRC code in response to said reception of said data portion;
- generating a header CRC code in response to said reception of said header portion;
- generating a CRC adjustment value in response to said reception of said data portion; and
- combining said data CRC code, said header CRC code and said CRC adjustment value so as to generate a final CRC code representing a CRC code corresponding to said data packets arranged inverse to the order of said reception of said data portion and said header portion.

8. The method of claim 7 wherein the step of combining CRC codes further comprises the steps of:
- multiplying said header CRC code by said CRC adjustment value in a Galois Field multiplier to produce an adjusted CRC code;
- adding said adjusted CRC code to said data CRC code in a modulo 2 adder to produce a final CRC code equivalent to a CRC code accumulated over the bytes of said data packet as though said data packet had been received in correct sequential order from said transmission source.

9. A method for receiving data packets containing a header portion received out of order following a remaining data portion, storing said data packets in fixed size memory page buffers restored to correct sequential order, said method being further adapted to generate a CRC code over bytes in said page buffers as said data packets are received and stored in said page buffers, said method being further adapted to transfer said page buffers to a block storage device for archival storage and to confirm correct transfer of said data from said page buffers to said block storage device, said method comprising the steps of:
- receiving said data packets from a transmission source;

applying said data packets to said page buffers as bytes of said data packets are received from said transmission source;

restoring sequential order of said data packets as said data packets are received from said transmission source such that said header portion of said data packet is stored in said page buffers before said remaining data portion;

accumulating a data CRC code as bytes of said remaining data portion are received from said transmission source;

accumulating a header CRC code as bytes of said header portion are received from said transmission source;

accumulating a header CRC adjustment value as bytes of said header portion are received from said transmission source;

accumulating a data CRC adjustment value as bytes of said remaining data portion are received from said transmission source;

combining said data CRC code, said header CRC code, said header CRC adjustment value, said data CRC adjustment code and a page buffer CRC code so as to generate a new page buffer CRC code equivalent to a CRC code accumulated as though all bytes stored in said page buffer had been received in correct sequential order from said transmission source;

saving said page buffer CRC code when said page buffer is completely filled with data from said data packets;

transferring a filled said page buffer to said block storage device;

accumulating an independent CRC code as said filled page buffer is transferred to said block storage device; and comparing said page buffer CRC code with said independent CRC code to determine if all data in said page buffer was successfully transferred to said block storage device.

10. The method of claim 9 wherein the step of restoring sequential order of said data packets further comprises the steps of:

saving the address of the next available location in said page buffers when the first byte of said remaining data portion is received;

reserving locations in said page buffer to store said header portion beginning at the next available location in said page buffers;

storing bytes of said remaining data portion in said page buffer at locations following said locations reserved for said header portion;

restoring said saved address of the first location of said reserved locations in said page buffer when the first byte of said header portion is received from said transmission source following the last byte of said remaining data portion; and storing said bytes of said header portion in said reserved locations of said page buffer.

11. The method of claim 9 wherein the step of combining CRC codes further comprises the steps of:

multiplying said page buffer CRC code by said header CRC adjustment value in a Galois Field multiplier to produce a first adjusted CRC code;

adding said first adjusted CRC code to said header CRC code in a modulo 2 adder to produce a partial CRC code;

multiplying said partial CRC code by said data CRC adjustment value in a Galois Field multiplier to produce a second adjusted CRC code; and adding said second adjusted CRC code to said data CRC code in a modulo 2 adder to produce a new page buffer CRC code equivalent to a CRC code accumulated as though all bytes stored in said page buffer had been received in correct sequential order from said transmission source.

* * * * *